(12) United States Patent
Choo et al.

(10) Patent No.: US 6,906,331 B2
(45) Date of Patent: Jun. 14, 2005

(54) X-RAY DETECTOR AND METHOD OF FABRICATING THEREFORE

(75) Inventors: Kyo-Seop Choo, Gumi-si (KR); June-Ho Park, Gumi-si (KR); Myung Ho You, Gumi-si (KR)

(73) Assignee: LG. Philips LCD Co., Ltd., Seoul (KR)

(*) Notice: Subject to any disclaimer, the term of this patent is extended or adjusted under 35 U.S.C. 154(b) by 0 days.

(21) Appl. No.: 10/815,771

(22) Filed: Apr. 2, 2004

(65) Prior Publication Data

US 2004/0183023 A1 Sep. 23, 2004

Related U.S. Application Data

(62) Division of application No. 10/095,105, filed on Mar. 12, 2002, now Pat. No. 6,737,653.

(30) Foreign Application Priority Data

Mar. 12, 2001 (KR) .......................................... 2001-12721
Jan. 3, 2002 (KR) .......................................... 2002-00160

(51) Int. Cl.$^7$ ................................................ G01T 1/24
(52) U.S. Cl. ........................... 250/370.09; 250/370.08; 257/428
(58) Field of Search .................... 250/370.09, 370.08, 250/370.01; 257/428, 431; 438/57

(56) References Cited

U.S. PATENT DOCUMENTS

| | | | | |
|---|---|---|---|---|
| 5,648,674 A | * | 7/1997 | Weisfield et al. | ........... 257/428 |
| 5,729,021 A | | 3/1998 | Brauers et al. | |
| 5,895,936 A | | 4/1999 | Lee | |
| 6,020,590 A | | 2/2000 | Aggas et al. | |
| 6,060,714 A | * | 5/2000 | Zhong et al. | ........... 250/370.09 |
| 6,380,543 B1 | | 4/2002 | Kim | |
| 6,403,965 B1 | | 6/2002 | Ikeda et al. | |
| 6,486,470 B2 | | 11/2002 | Huang | |
| 6,507,026 B2 | * | 1/2003 | Ikeda et al. | ........... 250/370.09 |
| 6,600,157 B2 | | 7/2003 | Watanabe et al. | |
| 6,825,473 B2 | * | 11/2004 | Watanabe | ........... 250/370.09 |
| 6,849,853 B2 | * | 2/2005 | Ikeda et al. | ........... 250/370.09 |

* cited by examiner

*Primary Examiner*—Albert Gagliardi
(74) *Attorney, Agent, or Firm*—McKenna Long & Aldridge LLP

(57) ABSTRACT

An array substrate for use in an X-ray sensing device includes a silicon insulator on a thin film transistor. The silicon insulator is silicon nitride or silicon oxide that has a strong adhesive strength to the active layer of the thin film transistor. Thereafter, an organic material, as a planarizing layer, is formed on the silicon insulator, so that the leakage current, which has a bad influence on the operation of the thin film transistor, can be prevented.

35 Claims, 40 Drawing Sheets

X-RAY DETECTOR AND METHOD OF FABRICATING THEREFORE

This application is a divisional of prior application Ser. No. 10/095,105, filed Mar. 12, 20002 U.S. Pat. No. 6,737, 653.

This application claims the benefit of Korean Patent Application Nos. 2001-12721 and 2002-160, filed on Mar. 12, 2001 and on Jan. 3, 2002, respectively, in Korea, which is hereby incorporated by reference for all purposes as if fully set forth herein.

BACKGROUND OF THE INVENTION

1. Field of the Invention

The present invention relates to X-ray detectors. More particularly, it relates to Thin Film Transistor (TFT) array substrates for use in X-ray detectors.

2. Description of Related Art

A widely used method of medical diagnosis is the X-ray film. As such films produce photographic images, time consuming film-processing procedures are required to obtain the results. However, digital X-ray sensing devices (referred to hereinafter as X-ray detectors) employing thin film transistors have been developed. Such X-ray sensing devices have the advantage of providing real time diagnosis.

FIG. 1 is a schematic cross-sectional view illustrating the structure and operation of an X-ray detector 100 according to a conventional art. Included are a lower substrate 1, a thin film transistor 3, a storage capacitor 10, a pixel electrode 12, a photoconductive film 2, a protection film 20, a conductive electrode 24 and a high voltage D.C. (direct current) power supply 26.

The photoconductive film 2 produces electron-hole pair 6 in proportion to the strength of external signals (such as incident electromagnetic waves). That is, the photoconductive film 2 acts as a converter that converts external signals, particularly X-rays, into electric signals. When an external voltage Ev is applied across a conductive electrode 24, that voltage causes the electron-hole pairs 6 in the photoconductive film 2 to separate such that X-ray induced electrical charges accumulate on the pixel electrode 12. Thus, either the electrons or the holes are then gathered by the pixel electrode 12 as electric charges.

As shown in FIG. 1, the pixel electrode 12 is located beneath the photoconductive film 2, and the electric charges that are gathered depend on the voltage (Ev) polarity that is applied to the conductive electrode 24 by the high voltage D.C. power supply 26. The gathered electric charges are accumulated in the storage capacitor 10, which is formed in connection with a grounding line. Charges in the storage capacitor 10 are then selectively transferred through a thin film transistor (TFT) 3, which is controlled externally, to an external image display device that forms an X-ray image.

In such an X-ray image sensing device, to detect and convert weak X-ray signals into electric charges, it is beneficial to decrease the trap state density (for the electric charge) in the photoconductive film 2 and to decrease charge flow in non-vertical directions. Further for sensing the weak X-ray signals, it is also essential to decrease leakage current when the TFT 3 is turned off.

FIG. 2 is a plan view illustrating one pixel of an array substrate for an X-ray detector according to the conventional art. A gate line 30 is arranged in a transverse direction and a data line 40 is arranged in a longitudinal direction. A thin film transistor (TFT) 3 acting as a switching element is formed near each crossing of the gate and data lines 30 and 40. A storage capacitor 10, which is arranged in a pixel region defined by a pair of gate line 30 and data line 40, includes a capacitor electrode 46, a pixel electrode 56 and a dielectric layer. The capacitor electrode 46 acts as not only a first electrode of the storage capacitor 10 but also a common electrode by way of being connected to its neighboring capacitor electrode. The pixel electrode 56 corresponds to the capacitor electrode 46 to act as a second electrode of the storage capacitor 10. Although not shown in FIG. 2, a dielectric layer is interposed between the capacitor electrode 46 and the pixel electrode 56. The pixel electrode 56 gathers the electric charges generated in the photoconductive film in order to keep the electric charges in the storage capacitor 10. Furthermore, the pixel electrode 56 is electrically connected to a drain electrode 44 of the TFT 3 via a drain contact hole 50 for transmitting the electric charges to the data line 40 through the TFT 3.

The operation of the X-ray detector described above is as follows. The electronic charges generated in the photoconductive film are gathered in the pixel electrode 56 and stored in the storage capacitor 10 having the capacitor electrode 46. The stored electronic charges are then moved to a source electrode 42 through the pixel and drain electrodes 56 and 44 by the operation of the TFT 3. Thereafter, the electronic charges move through the data line 40 and finally display the images in the external image display device.

The fabrication steps of the array substrate illustrated in FIG. 2 will be explained with reference to FIGS. 3A to 3G, which are cross-sectional views taken along line III—III of FIG. 2.

Referring to FIG. 3A, a first metal layer is formed on a substrate 1 by depositing a metallic material such as Aluminum (Al) or Al-alloy (e.g., AlNd). A gate line (see reference element 30 of FIG. 2) and a gate electrode 32 that extends from the gate line are then formed by patterning the first metal layer. As a material for the substrate 1, either a quartz having a high melting point or a glass having a relatively low melting point can be used. Since the glass is cheap and has a low melting point rather than the quartz, the glass is more adequate for the substrate that is used in under the low temperature process.

In FIG. 3B, a first insulation layer 60 is deposited to a thickness of 4000 angstroms (Å) over the substrate 1 and over the first patterned metal layer. The first insulation layer 60 can be comprised of an inorganic substance, such as Silicon Nitride ($SiN_x$) or Silicon Oxide ($SiO_x$). A pure amorphous silicon (a-Si:H) layer and a doped amorphous silicon ($n^+$ a-Si:H) layer are sequentially formed on the first insulation layer 60. Those silicon layers are then patterned to form an active layer 62 and an ohmic contact layer 64. CVD (Chemical Vapor Deposition) or the Ion Injection Method can beneficially be used to form the doped amorphous silicon layer.

FIG. 3C shows a step of forming a source electrode 42, a drain electrode 44, and a capacitor electrode 46. First, a second conductive metal layer is deposited on the first insulation layer 60 to cover the active layer 62 and the ohmic contact layer 64. The second conductive metal layer is then patterned to simultaneously form the source electrode 42, which extends from the data line 40 over the gate electrode 32; the drain electrode 44, which is spaced apart from the source electrode 42 and over the gate electrode 32; and the capacitor electrode 46, which is the first electrode of the storage capacitor 10 (see FIG. 2). Thereafter, a portion of the ohmic contact layer 64 on the active layer 62 is then etched to form a channel region using the source and drain electrodes 42 and 44 as masks. Thus, the TFT 3 (see FIG. 2) is complete.

Next in FIG. 3D, a planarizing protection layer 66 that acts as a dielectric layer in the storage capacitor is formed over the TFT and on the capacitor electrode 46. The planarizing protection layer 66 is then patterned to form a drain contact hole 50 to expose a portion of the drain electrode 44. The planarizing protection layer 66 is made of an organic material, such as benzocyclobutene (BCB) or acryl-based resin, thereby planarizing the surface of the substrate 1 having the TFT and capacitor electrode 66.

Referring now to FIG. 3E, a pixel electrode 56, which connects to the drain electrode 44 via the drain contact hole 50, is formed by depositing and patterning a transparent conductive material such as ITO (indium-tin-oxide) or IZO (indium-zinc-oxide).

Now referring to FIG. 3F, a photoconductive film 2 and a protection layer 20 are sequentially formed on the pixel electrode 56. As described hereinbefore, the photoconductive film 2 converts the external signals, particularly X-rays, into the electrical signals. The photoconductive film 2 is beneficially comprised of an amorphous selenium compound that is deposited in a thickness of 100 to 500 micrometers ($\mu$m) by an evaporator. When the photoconductive film 2 is exposed to the X-rays, electron-hole pairs are produced in the photoconductive film in accordance with the strength of the X-rays.

In FIG. 3G, a conductive electrode 24 that is made of a transparent material to transmit the external X-rays is formed on the protection layer 20. If the X-rays are applied to the photoconductive film 2 while an external voltage is applied to the conductive electrode 24, the electron-hole pairs separate and either the electrons or the holes accumulate in the pixel electrode 56 as the electric charges. Therefore, the accumulated electric charges are stored in the storage capacitor (reference element 10 of FIG. 2).

In the above-mentioned array substrate for the X-ray detector, however, some problems occur when practicing the disclosed configuration and process of fabricating the array substrate. The planarizing protection layer 66 made of benzocyclobutene (BCB) directly contacts the active channel that is made of the amorphous silicon, as shown in FIG. 3D. Since BCB of the planarizing protection layer 66 has a poor adhesion to the amorphous silicon of the active channel, a trap state, by which the electric charges are trapped in an interface between the active channel and the planarizing protection layer (i.e., BCB), exists. Therefore, the release of electric charges is reduced and abnormal leakage current occurs as shown in FIG. 4.

FIG. 4 is a graph showing the relation between gate voltage ($V_g$) and drain current ($I_d$) of the thin film transistor according to a conventional X-ray detector. The leakage current characteristics are illustrated in the graph of FIG. 4. When the gate voltage is 0V, the thin film transistor does not operate, and the electric current flowing through the thin film transistor ideally should be close to zero (0). However, when the trap state exists in the active channel, the current "K" affecting the operating characteristics of TFT (i.e., leakage current) remains, although the gate voltage is zero (0V), as shown in FIG. 4.

Furthermore in the above-mentioned array substrate for the X-ray detector, since the planarizing protection layer (i.e., BCB) serves as a dielectric layer in the storage capacitor, the thickness of the dielectric layer is increased. As a result, the capacity of the storage capacitor is reduced.

SUMMARY OF THE INVENTION

Accordingly, the present invention is directed to an array substrate for an X-ray detector that substantially obviates one or more of the problems due to limitations and disadvantages of the related art.

An advantage of the present invention is to provide a method and array substrate for use in an X-ray sensing device, which improve adhesive strength between an active channel and a passivation layer thereon.

Another advantage of the present invention is to provide a method and array substrate for use in an X-ray detector, which raise electric capacity of storage capacitor.

Additional features and advantages of the invention will be set forth in the description that follows, and in part will be apparent from that description, or may be learned by practice of the invention. The objectives and other advantages of the invention will be realized and attained by the structure particularly pointed out in the written description and claims hereof as well as the appended drawings.

In order to accomplish at least one of the above advantages, the principles of the present invention provide an array substrate for X-ray detector. That array substrate includes a substrate having a switching region and a pixel region; a gate line on a substrate, the gate line having a gate pad at the end thereof; a gate insulation layer on said gate line; a data line on said gate insulation layer, the data line perpendicularly crossing said gate line to define the pixel region and contacting a data pad at the end thereof; a thin film transistor in the switching region near the crossing of the said gate and data lines, the thin film transistor including a gate electrode, an active layer, a source electrode, a drain electrode and said gate insulation layer; a ground line crossing said pixel region parallel with the data line and contacting a ground pad at the end thereof; a first passivation layer formed of a silicon insulator, the first passivation layer covering said thin film transistor and having contact holes that expose the drain electrode and the ground line; a second passivation layer formed of an organic material on the said first passivation layer, the second passivation layer having contact holes that expose the drain electrode and the ground line; a first capacitor electrode on the second passivation layer, the first capacitor electrode contacting the ground line through said contact holes that expose the ground line; an auxiliary drain electrode on the second passivation layer, the auxiliary drain electrode contacting the drain electrode through said contact hole that exposes the drain electrode; a third passivation layer on the second passivation layer, the third passivation layer covering the auxiliary drain electrode and the first capacitor electrode, and having a contact hole that exposes said auxiliary drain electrode; and a second capacitor electrode on the third passivation layer, the second capacitor electrode electrically contacting the drain electrode and overlapping the first capacitor electrode thereby forming a storage capacitor with the first capacitor electrode and the third passivation layer. The array substrate mentioned above further includes an ohmic contact layer on the active layer.

In order to accomplish the above advantages, the principles of the present invention further provide a method of fabricating an array substrate for use in an X-ray sensing device. The method includes forming a gate line on a substrate that has a switching region and a pixel region, the gate line having a gate pad at the end thereof; forming a gate insulation layer on said substrate to cover said gate line; forming a data line on said gate insulation layer, the data line perpendicularly crossing said gate line to define the pixel region and contacting a data pad at the end thereof; forming a thin film transistor in the switching region near the crossing of the said gate and data lines, wherein the thin film transistor includes a gate electrode, an active layer, a source electrode, a drain electrode and said gate insulation layer; forming a ground line that crosses said pixel region parallel with the data line and contacts a ground pad at the end thereof; forming a first passivation layer formed of a silicon insulator, the first passivation layer covering said thin film transistor and having contact holes that expose the drain electrode and the ground line; forming a second passivation layer formed of an organic material on the said first passivation layer, the second passivation layer having contact holes that expose the drain electrode and the ground line; forming a first capacitor electrode on the second passivation layer, the first capacitor electrode contacting the ground line through said contact holes that expose the ground line; forming an auxiliary drain electrode on the second passivation layer, the auxiliary drain electrode contacting the drain electrode through said contact hole that exposes the drain electrode; forming a third passivation layer on the second passivation layer, the third passivation layer covering the auxiliary drain electrode and the first capacitor electrode, and having a contact hole that exposes said auxiliary drain electrode; and forming a second capacitor electrode on the third passivation layer, the second capacitor electrode electrically contacting the drain electrode and overlapping the first capacitor electrode thereby forming a storage capacitor with the first capacitor electrode and the third passivation layer.

The method of fabricating an array substrate further includes a step of forming an ohmic contact layer on the active layer and a step of etching a portion of the ohmic contact layer using the source and drain electrodes as masks so as to form an active channel on the active layer.

In the above-mentioned method, the gate line and the gate electrode have a double-layered structure that is comprised of a first layer and a second layer. The first layer includes aluminum (Al), while the second layer includes a metallic material selected from a group comprising chromium (Cr), tungsten (W) and molybdenum (Mo). The gate pad, the data pad and the ground pad are formed in the same plane using the same material. The gate insulation layer includes a data pad contact hole that expose a portion of the data pad and a ground pad contact hole that expose a portion of the ground pad. The data line contacts the data pad through said data pad contact hole, and the ground line contacts the ground pad through said ground pad contact hole.

Moreover, the second capacitor electrode extends over the thin film transistor. The second passivation layer includes benzocyclobutene (BCB) or acryl-based resin. The silicon insulator includes silicon nitride ($SiN_x$) or silicon oxide ($SiO_2$). The first and second capacitor electrodes are formed of indium tin oxide (ITO) or indium zinc oxide (IZO).

The method of fabricating an array substrate further includes a step of forming a gate pad contact hole, a data pad contact hole and a ground pad contact hole which penetrate the gate insulation layer and the first, second and third passivation layer. The gate pad contact hole exposes a portion of the gate pad, the data pad contact hole exposes a portion of the data pad, and the ground pad contact hole exposes a portion of the ground pad.

In order to accomplish at least one of the above advantages, in another aspect, the principles of the present invention provide an array substrate for X-ray detector. That array substrate includes: a substrate having a switching region and a pixel region; a gate line on a substrate, the gate line having a gate linking line and a gate pad at the end thereof; a gate insulation layer on said gate line; a data line on said gate insulation layer, the data line perpendicularly crossing said gate line to define the pixel region and having a data linking line and a data pad at the end thereof; a thin film transistor in the switching region near the crossing of the said gate and data lines, the thin film transistor including a gate electrode, an active layer, a source electrode, a drain electrode and said gate insulation layer; a ground line crossing said pixel region parallel with the data line and having a ground linking line and a ground pad at the end thereof; a first passivation layer formed of a silicon insulator, the first passivation layer covering said thin film transistor and having a first drain contact hole that exposes the drain electrode and a first ground line contact hole that exposes the ground line; a gate pad electrode formed on the first passivation layer, the gate pad electrode contacting the gate pad through a first gate pad contact hole that penetrates both the gate insulation layer and the first passivation layer; a data pad electrode formed on the first passivation layer, the data pad electrodes contacting the data pad though a first data pad contact hole that penetrates the first passivation layer; a ground pad electrode formed on the first passivation layer, the ground pad electrode contacting the ground pad though a first ground pad contact hole that penetrates the first passivation layer; a second passivation layer formed of an organic material on the first passivation layer, the second passivation layer covering the gate pad electrode, the data pad electrode and the ground pad electrode, and having a second drain contact hole that exposes the drain electrode and a second ground line contact hole that exposes the ground line; a first capacitor electrode on the second passivation layer, the first capacitor electrode contacting the ground line through said first and second ground line contact holes; an auxiliary drain electrode on the second passivation layer, the auxiliary drain electrode contacting the drain electrode through said first and second drain contact holes; a third passivation layer on the second passivation layer, the third passivation layer covering the auxiliary drain electrode and the first capacitor electrode, and having an auxiliary drain contact hole that exposes said auxiliary drain electrode; and a second capacitor electrode on the third passivation layer, the second capacitor electrode electrically contacting the drain electrode and overlapping the first capacitor electrode thereby forming a storage capacitor with the first capacitor electrode and the third passivation layer; wherein the second and third passivation layers have a second gate pad contact hole that exposes the gate pad electrode, a second data pad contact hole that exposes the data pad electrode, and a ground pad contact hole that exposes the ground pad electrode.

In order to accomplish the above advantages, in another aspect, the principles of the present invention further provide a method of fabricating an array substrate for use in an X-ray sensing device. The method includes; forming a gate line on a substrate that has a switching region and a pixel region, the gate line having a gate linking line and a gate pad at the end thereof; forming a gate insulation layer on said substrate to cover said gate line; forming a data line on said gate insulation layer, the data line perpendicularly crossing said gate line to define the pixel region and having a data linking line and a data pad at the end thereof; forming a thin film transistor in the switching region near the crossing of the said gate and data lines, wherein the thin film transistor includes a gate electrode, an active layer, a source electrode, a drain electrode and said gate insulation layer; forming a ground line that crosses said pixel region parallel with the data line and having a ground linking line and a ground pad at the end thereof; forming a first passivation layer formed of a silicon insulator, the first passivation layer covering said thin film transistor and having a first drain contact hole that exposes the drain electrode and a first ground line contact hole that exposes the ground line; forming a gate pad electrode on the first passivation layer, wherein the gate pad electrode contacts the gate pad through a first gate pad contact hole that penetrates both the gate insulation layer and the first passivation layer; forming a data pad electrode on the first passivation layer, wherein the data pad electrodes contacts the data pad though a first data pad contact hole that penetrates the first passivation layer; forming a ground pad electrode on the first passivation layer, wherein the ground pad electrode contacts the ground pad though a first ground pad contact hole that penetrates the first passivation layer; forming a second passivation layer formed of an organic material on the said first passivation layer, the second passivation layer covering the gate pad electrode, the data pad electrode and the ground pad electrode, and having a second drain contact hole that exposes the drain electrode and a second ground line contact hole that exposes the ground line; forming a first capacitor electrode on the second passivation layer, the first capacitor electrode contacting the ground line through said first and second ground line contact holes; forming an auxiliary drain electrode on the second passivation layer, the auxiliary drain electrode contacting the drain electrode through said first and second drain contact holes; forming a third passivation layer on the second passivation layer, the third passivation layer covering the auxiliary drain electrode and the first capacitor electrode, and having an auxiliary drain contact hole that exposes said auxiliary drain electrode; forming a second capacitor electrode on the third passivation layer, the second capacitor electrode electrically contacting the drain electrode and overlapping the first capacitor electrode thereby forming a storage capacitor with the first capacitor electrode and the third passivation layer; and etching portions of the second and third passivation layers to form a second gate pad contact hole that exposes the gate pad electrode, a second data pad contact hole that exposes the data pad electrode and a ground pad contact hole that exposes the ground pad electrode.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE ILLUSTRATED EMBODIMENTS

Reference will now be made in detail to illustrated embodiments of the present invention, examples of which are shown in the accompanying drawings. Wherever possible, the similar reference numbers will be used throughout the drawings to refer to the same or the parts.

Figure 5:
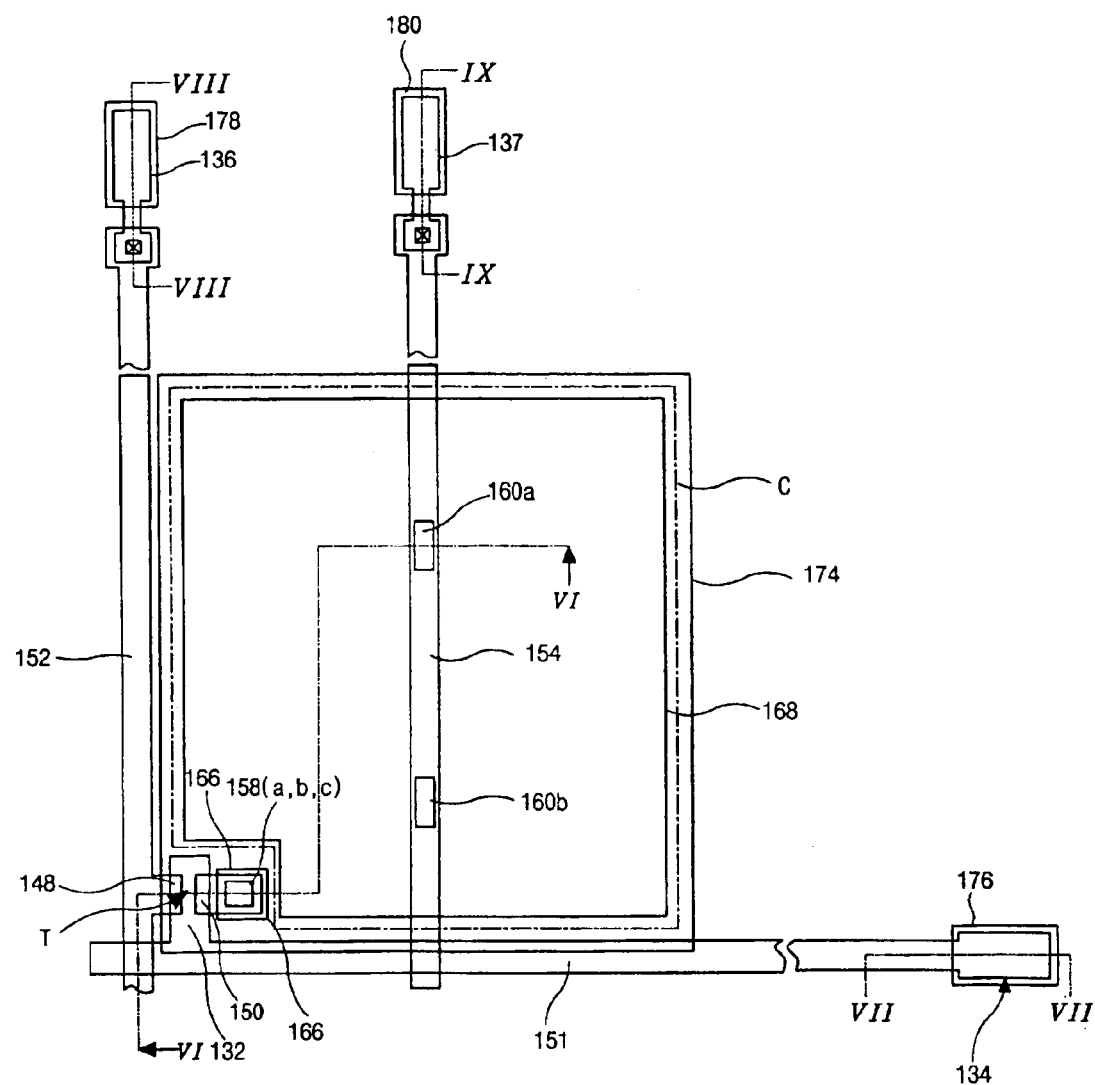
FIG. 5 is a partial schematic plan view of an array substrate for use in an X-ray detector that is in accord with a first embodiment of the principles of the present invention.

FIG. 5 is a partial schematic plan view of an array substrate for use in an X-ray detector that is in accord with a first embodiment of the principles of the present invention. As shown in FIG. 5, a gate line 151 and a data line 152 cross each other and define a pixel region. A gate pad 134 is formed at the end of the gate line 151, and a data pad 136 is formed at the end of the data line 152. The gate pad 134 and the data pad 136 are associated with a gate pad contact hole 176 and a data pad contact hole 178, respectively. A thin film transistor (TFT) "T" acting as a switching element is positioned near the crossing of the gate line 151 and the data line 152, and a storage capacitor "C" is positioned in the pixel region. The TFT "T" includes a gate electrode 132, a source electrode 148 drain electrode 150, and the storage capacitor "C" includes a capacitor electrode 168 pixel electrode 174. The capacitor electrode 168 as a first electrode of the storage capacitor "C", whereas the pixel electrode 174 serves as a second electrode of the storage capacitor "C." Although not shown in FIG. 5, silicon nitride is interposed between the capacitor electrode 168 and the pixel electrode 174. The pixel electrode 174 extends over the TFT "T" in order to increase the electric capacity of the storage capacitor. Electric charges generated in a photoconductive film gather and accumulate in the pixel electrode 174.

Still referring to FIG. 5, a ground line 154 is arranged substantially perpendicular to the gate line 151, crossing across the pixel region and the storage capacitor "C". Here, the ground line 154 acts as a common line for neighboring pixels, and at least one ground line contact hole 160 through which the capacitor electrode 168 contacts the ground line 154 is formed on the ground line 154. A ground pad 137 that is associated with a ground pad contact hole 180 is located at the end of the ground line 154.

Furthermore, the pixel electrode 174 is electrically connected to the drain electrode 150 of the TFT "T" via a drain contact hole 158, so the electric charges stored in the storage capacitor "C" flow to the data line 152 when the TFT "T" operates. These charges transmitted to the data line 152 are then transferred to an external image display device to form X-ray images.

The fabrication steps of the array substrate illustrated in FIG. 5 will be explained with reference to FIGS. 6A to 6K, 7A to 7K, 8A to 8K and 9A to 9K, which are cross-sectional views taken along lines VI—VI, VII—VII, VIII—VIII and IX—IX of FIG. 5, respectively.

Referring now to FIGS. 6A, 7A, 8A and 9A, a gate buffer 102, a data buffer 104 and ground buffer 105 are formed on a substrate 100. These buffers 102, 103 and 104 heighten the gate pad 134, the data pad 136 and the ground pad 137 of FIG. 5. The reason for heightening those pads is to allow external lines to easily contact those pads 134, 136 and 137. Namely, when the gate buffer 102, the data buffer 104 and the ground buffer 105 are formed under the gate pad 134, the data pad 136 and the ground pad 137, respectively, those pads do not require additional electrodes to electrically contact the external lines. Those buffers 102, 103 and 104 can be made of an insulating material or a metallic material.

In FIGS. 6B, 7B, 8B and 9B, a first metal layer and a second metal layer are sequentially formed on the substrate 100 to cover the gate buffer 102, the data buffer 104 and the ground buffer, and then patterned to form a gate electrode 132, a gate line 151, a gate pad 134, a data pad 136 and a ground pad 137, which have double-layered structures. The first metal layer is formed of Aluminum (Al) or Aluminum alloy (e.g., AlNd), while a second metal layer is formed of one of Chromium (Cr), Tungsten (W) and Molybdenum (Mo). Therefore, the gate electrode 132, the gate pad 134, the data pad 136 and the ground pad 137 include first layers 132a, 134a, 136a and 137a, and second layers 132b, 134b, 136b and 137b, respectively. Aluminum (Al) or Aluminum alloy usually has low resistance and reduced signal delay. But Aluminum (Al) or Aluminum alloy is chemically weak when exposed to acidic processing and may result in formation of hillocks during processing. Accordingly, multilayered aluminum structures, as shown in FIGS. 6B, 7B, 8B and 9B are used for the gate electrode 132, gate line 151, gate pad 134, data pad 136 and ground pad 137.

Figure 7A:
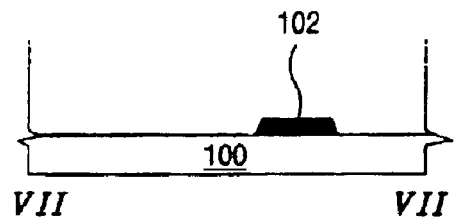
Figure 7B:
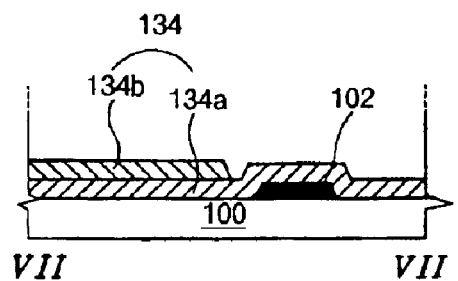
Figure 7C:
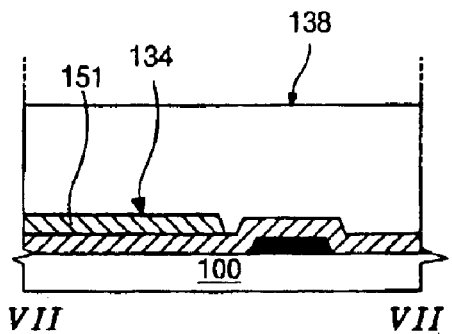
Figure 7D:
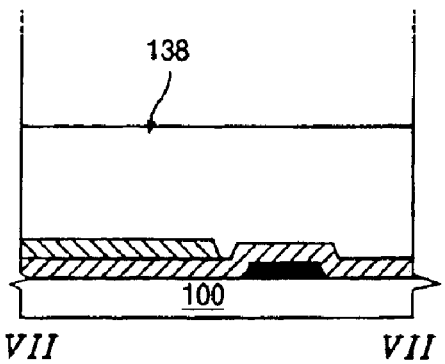
Figure 7E:
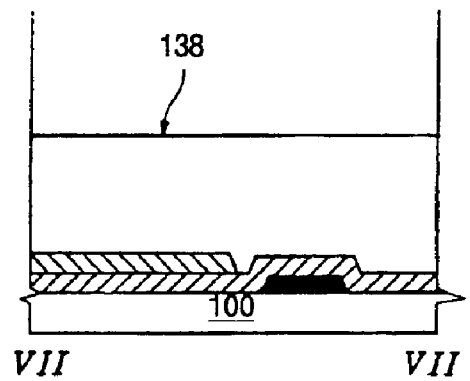
Figure 7F:
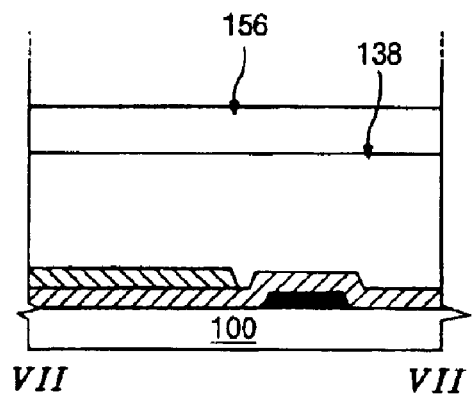
Figure 7G:
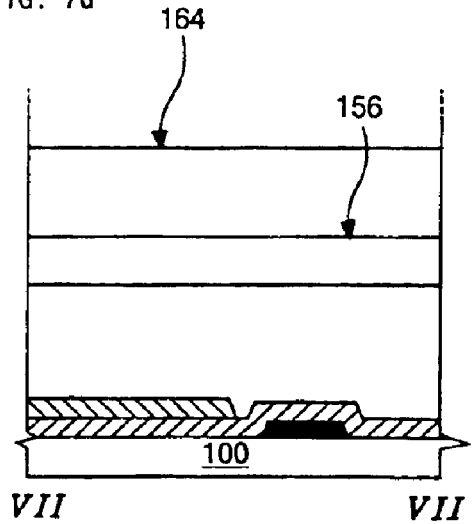
Figure 7H:
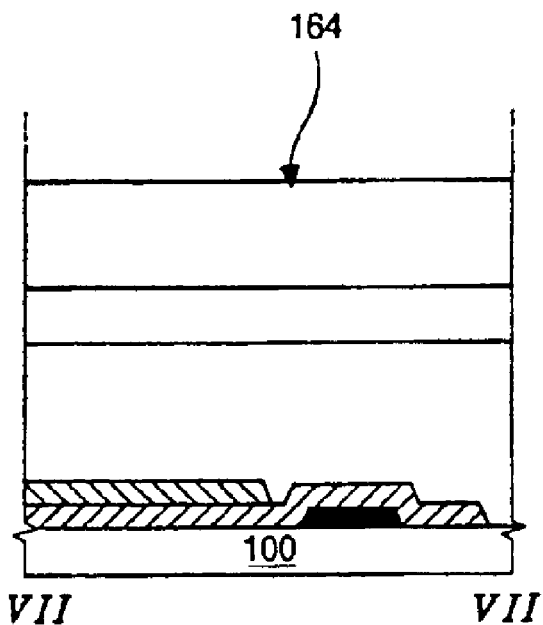
Figure 8A:
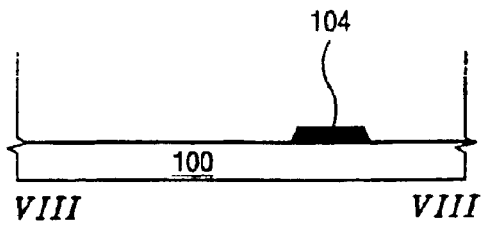
Figure 8B:
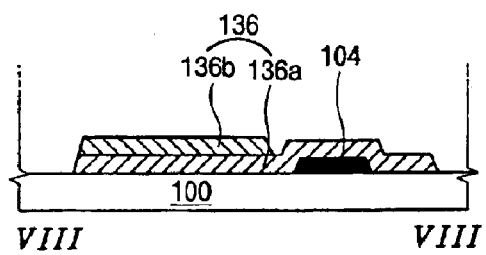
Figure 8C:
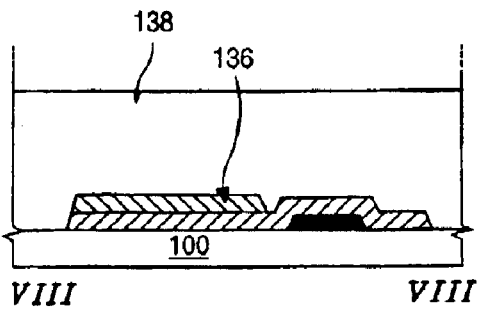
Figure 8D:
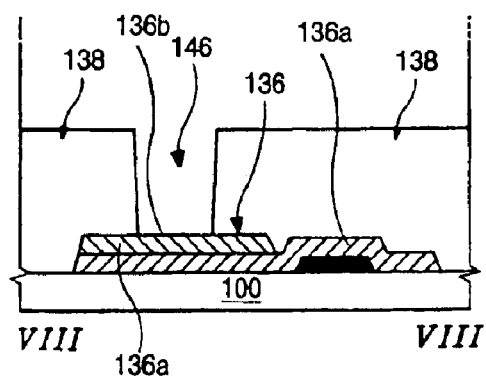
Figure 8E:
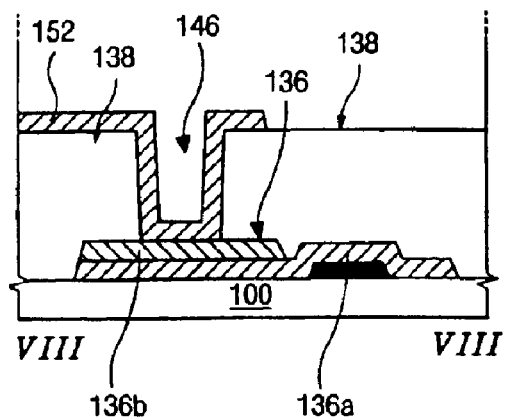
Figure 8F:
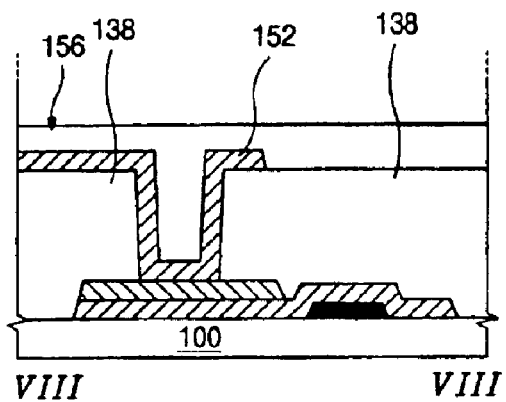
Figure 8G:
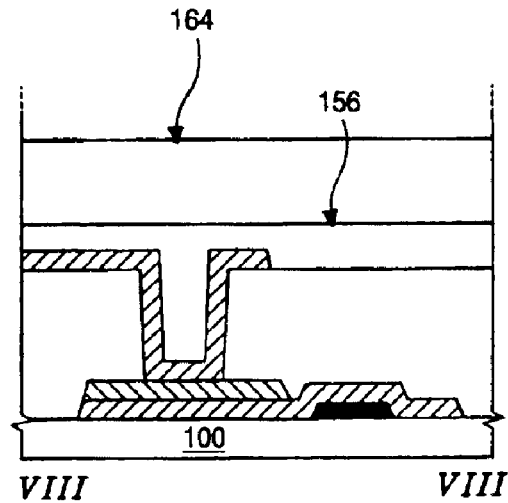
Figure 8H:
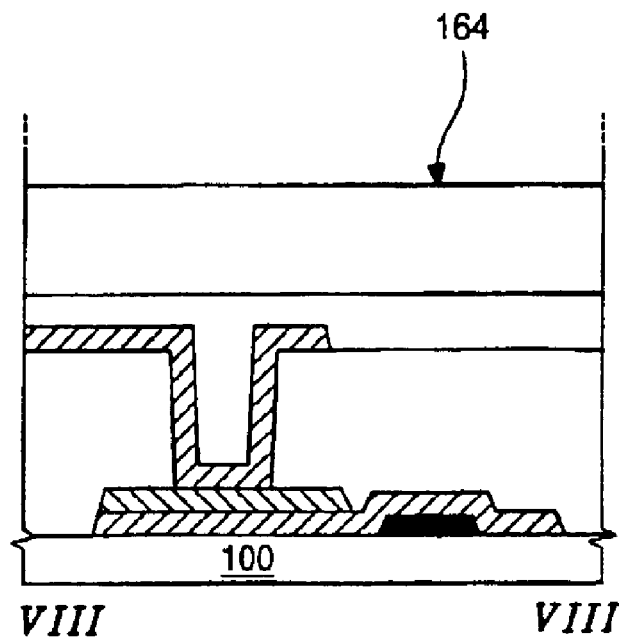
Figure 9A:
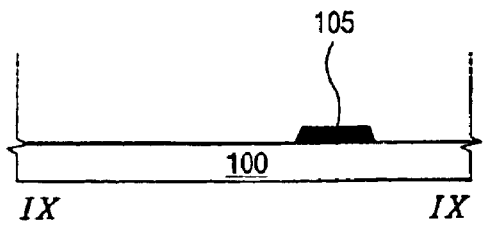
Figure 9B:
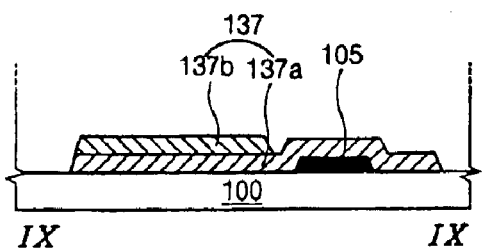
Figure 9C:
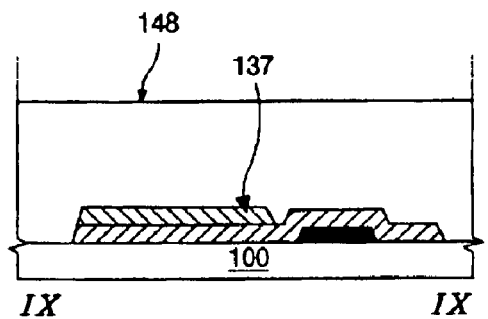
Figure 9D:
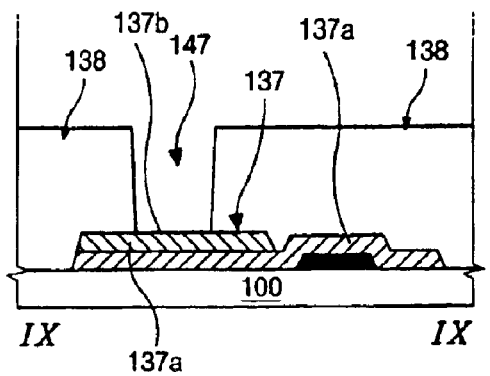
Figure 9E:
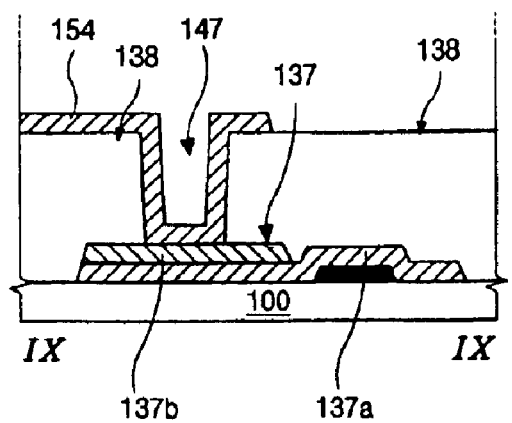
Figure 9F:
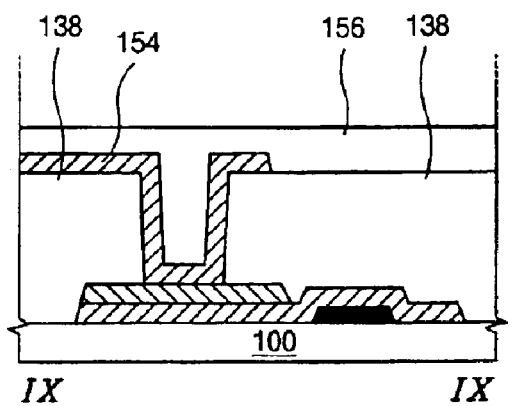
Figure 9G:
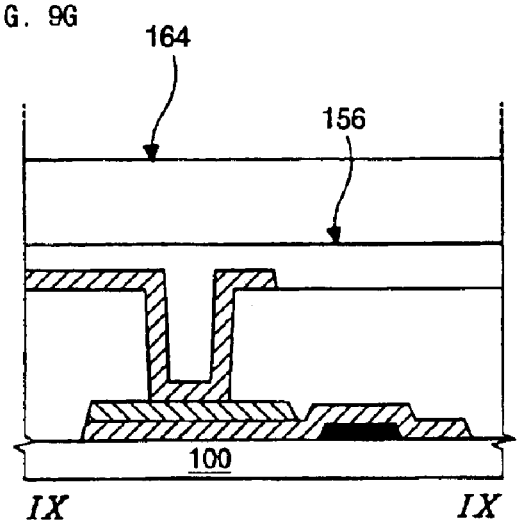
Figure 9H:
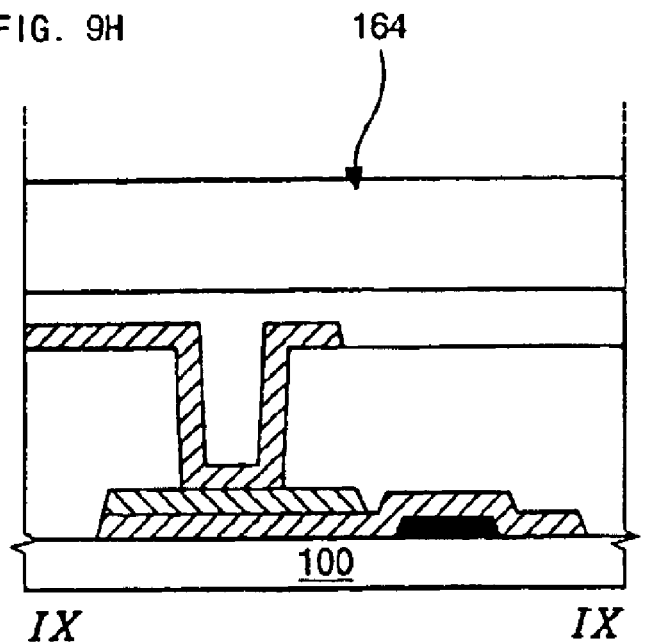

Referring to FIGS. 7B, 8B and 9B, the second layers 134b, 136b and 137b do not exist over the buffers 102, 104 and 105 because portions of the pads 134, 136 and 137 over the buffers 102, 104 and 105 require a low electrical resistance when they are bonded to the external lines. By exposing the first layers 134a, 136a and 137a that have a relatively low electrical resistance, rather than the second layers of the pads, the contact resistance between the pads 134, 136 and 137 and the external lines is reduced.

Next in FIGS. 6C, 7C, 8C and 9C, a gate insulation layer 138 is formed on the substrate 100 to cover the gate electrode 132, the gate line 151, the gate pad 134, the data pad 136 and the ground pad 137. The gate insulation layer 138 has a thickness ranging from about 100 to about 3000 angstroms (Å), and is an inorganic substance such as Silicon Nitride ($SiN_x$) or Silicon Oxide ($SiO_x$), or an organic substance such as BCB (Benzocyclobutene) or an acryl.

FIGS. 6D, 7D, 8D and 9D show a step of forming an active layer 140 and an ohmic contact layer 142. First, a pure amorphous silicon (a-Si:H) layer and a doped amorphous silicon ($n^+$ a-Si:H) layer are then sequentially formed on the gate insulation layer 138 and then patterned to form the active layer 140 and the ohmic contact layer 142 over the gate electrode 132. Thereafter, portions of the gate insulation layer 138 are etched to form a data line contact hole 146 to the data pad 136 and a ground line contact hole 147 to the ground pad 137. The data line contact hole 146 exposes the data pad second layer 136b in order to contact the data line (reference element 152 of FIG. 5) to the data pad 136 therethrough, and the ground line contact hole 147 exposes the ground pad second layer 137b in order to contact the ground line (reference element 154 of FIG. 5) to the ground pad 137 therethrough.

In FIGS. 6E, 7E, 8E and 9E, a third metal layer is deposited on the gate insulation layer 138 to cover the ohmic contact layer 142, and then patterned to form a source electrode 148, a drain electrode 150, a data line 152 and a ground line 154. The source electrode 148 is formed on the ohmic contact layer 142 and over the gate electrode 132 as an extension of the data line 152. The drain electrode 150 is also formed on the ohmic contact layer 142 and over the gate electrode 132 and spaced apart from the source electrode 148. As shown in FIG. 5, the ground line 154 is parallel with the data line 152 and crosses the pixel region defined by a pair of gate line 151 and data line 152. The end of the data line 152 contacts the data pad second layer 136b through the data line contact hole 146, and the end of the ground line 154 contacts the ground pad second layer 137b through the ground line contact hole 147. After patterning the third metal layer, a portion of the ohmic contact layer 142 on the active layer 140 is then etched to form a channel region using the source and drain electrodes 148 and 150 as masks. Thus, the TFT "T" (see FIG. 5) is completed.

FIGS. 6F, 7F, 8F and 9F show a step of forming a first passivation layer 156 on the gate insulation layer 138. The first passivation layer 156 is formed by depositing a silicon insulator (e.g., silicon nitride ($SiN_x$) or silicon oxide ($SiN_2$)) by a thickness of about 500 to about 1300 angstroms (Å). Because the silicon insulator has a superior adhesive strength to the active layer 140, the trap state density is decreased in the interface between the active layer 140 and the first passivation layer 156. Therefore, the area trapping the electric charges is reduced and the electron mobility increases. It is also possible to prevent the leakage current characteristics that are presented by direct-contacting the organic material (e.g., BCB) to the active layer 140. Now referring to FIG. 6F, the first passivation layer 156 is patterned to form a first drain contact hole 158a and a first ground line contact hole 160a. The first drain contact hole 158a exposes a portion of the drain electrode 150 and the first ground line contact hole 160a exposes a portion of the ground line 154.

FIGS. 6G, 7G, 8G and 9G are cross-sectional views showing a step of forming a second passivation layer 164. An organic material, such as benzocyclobutene (BCB) or acryl-based resin, is formed on the first passivation layer 156 by a thickness of about 1 to about 1.5 micrometers ($\mu$m), thereby forming the second passivation layer 164. That organic material acts as not only a passivation layer but also a planarizing layer. Namely, although the TFT region is higher than the pixel region as shown in FIG. 6F, 7F, 8F and 9F, the second passivation layer 164 makes the surface of substrate planar because the second passivation layer 164 is formed of the organic material such as benzocyclobutene (BCB) or acryl-based resin. The second passivation layer 164 is then etched to form a second drain contact hole 158b and a second ground line contact hole 160b. The second drain contact hole 158b corresponds to the first drain contact hole 158a of FIG. 6F, and also exposes the portion of the drain electrode 150. Further, the second ground line contact hole 160b corresponds to the first ground line contact hole 160a, and also exposes the portion of the ground line 154.

In contrast to the above-mentioned processes, the first and second drain contact holes 158a and 158b can be formed in the same mask process. Further, the first and second ground line contact holes 160a and 160b can also be formed by the same mask process.

Now in FIGS. 6H, 7H, 8H and 9H, a transparent conductive material, such as ITO (indium tin oxide) or IZO (indium zinc oxide), is formed on the second passivation layer 164 and then patterned to form an auxiliary drain electrode 166 and a capacitor electrode 168. The auxiliary drain electrode 166 contacts the drain electrode 150 through the drain contact hole 158 and is spaced apart from the capacitor electrode 168. The capacitor electrode 168 contacts the ground line 154 through the ground line contact hole 160 and is positioned in the pixel region as shown in FIG. 5.

Figure 6A:
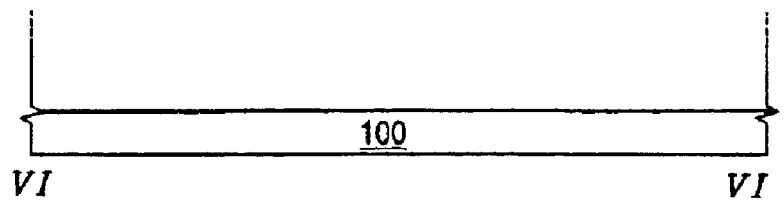
FIGS. 6A to 6K, 7A to 7K, 8A to 8K and 9A to 9K are cross sectional views taken along lines VI—VI, VII—VII, VIII—VIII and IX—IX of FIG. 5, respectively, and help illustrate the manufacturing steps for the array substrate according to the first embodiment of the present invention.
Figure 6B:
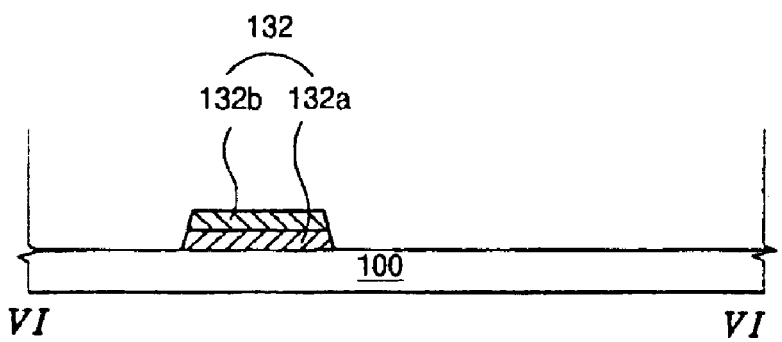
Figure 6C:
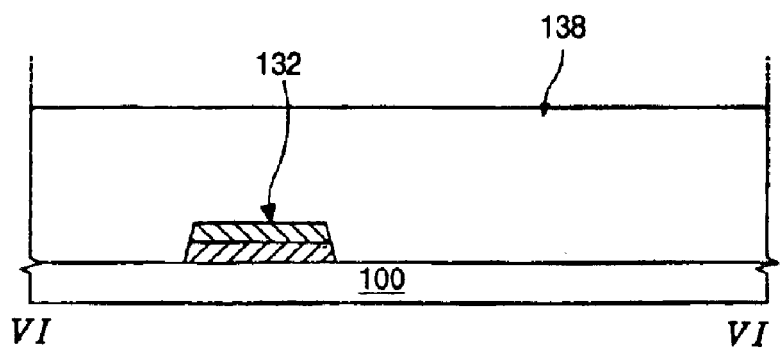
Figure 6D:
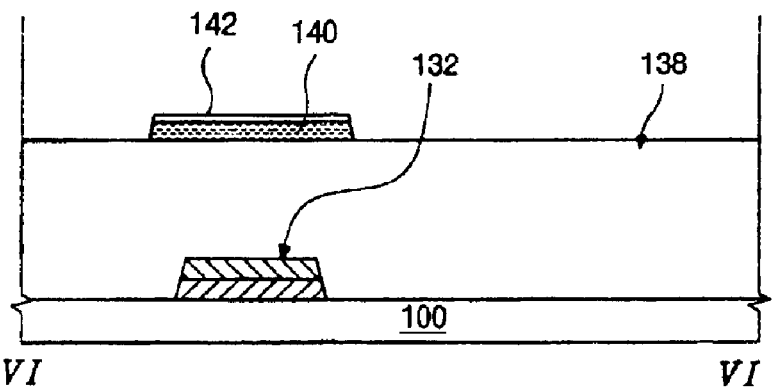
Figure 6E:
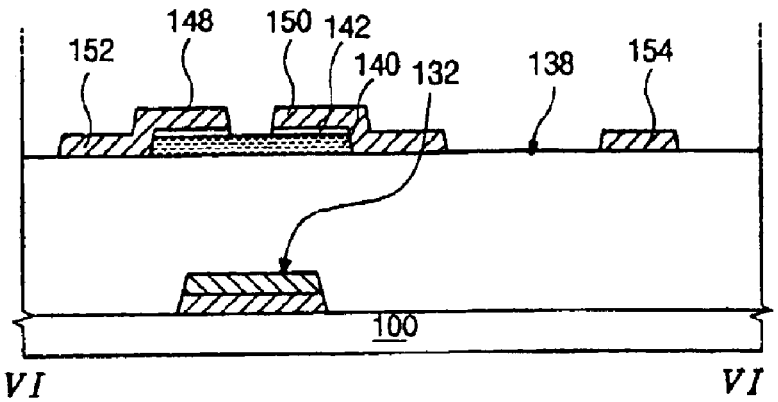
Figure 6F:
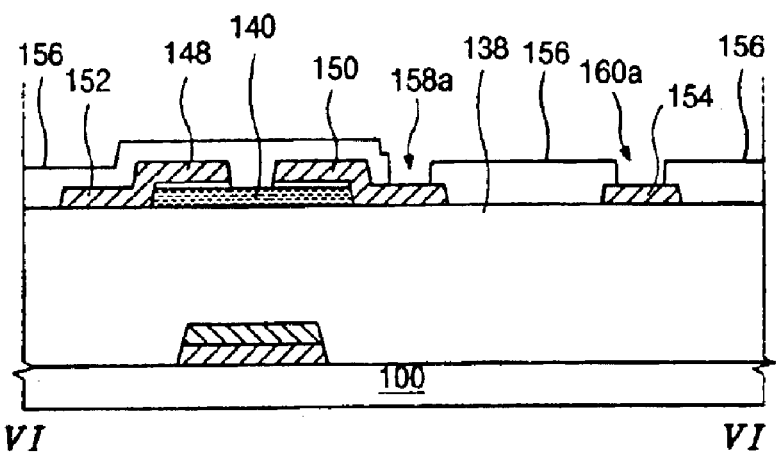
Figure 6G:
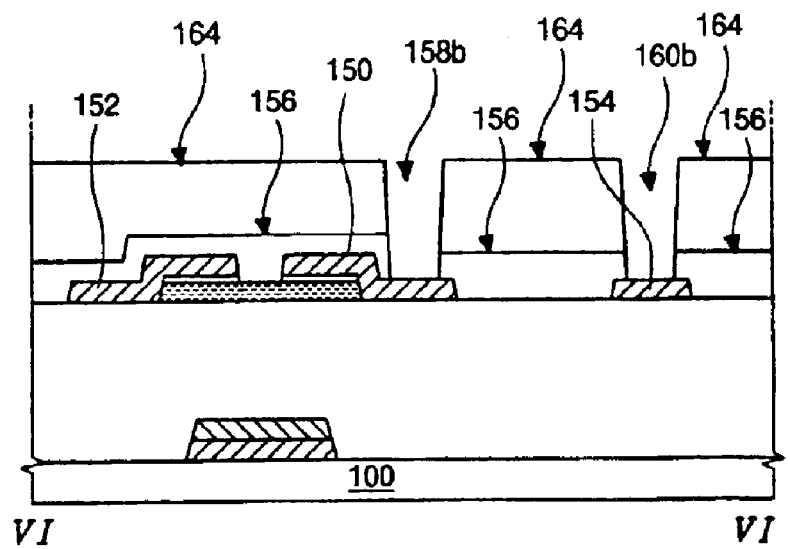
Figure 6H:
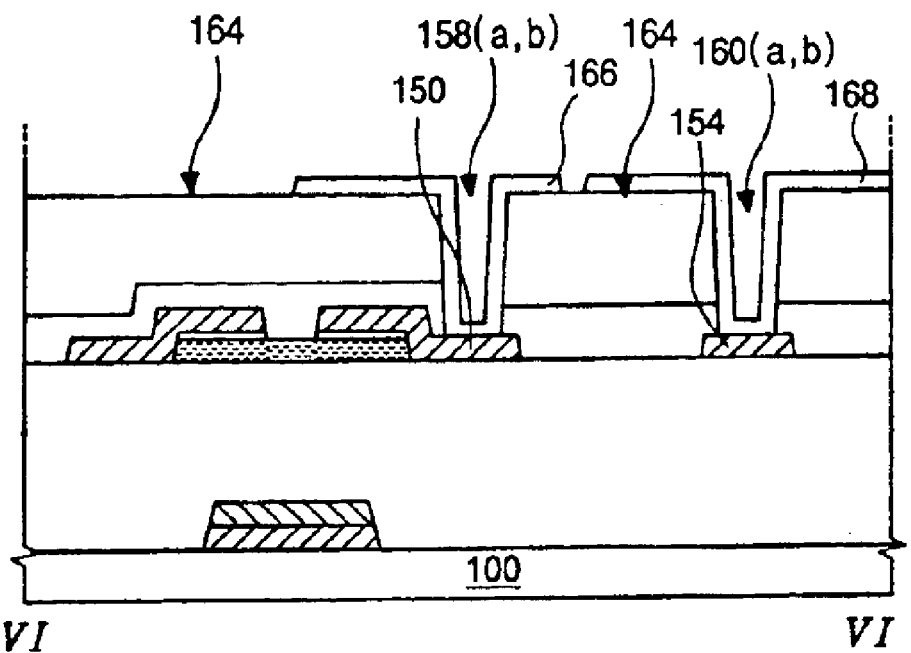
Figure 6I:
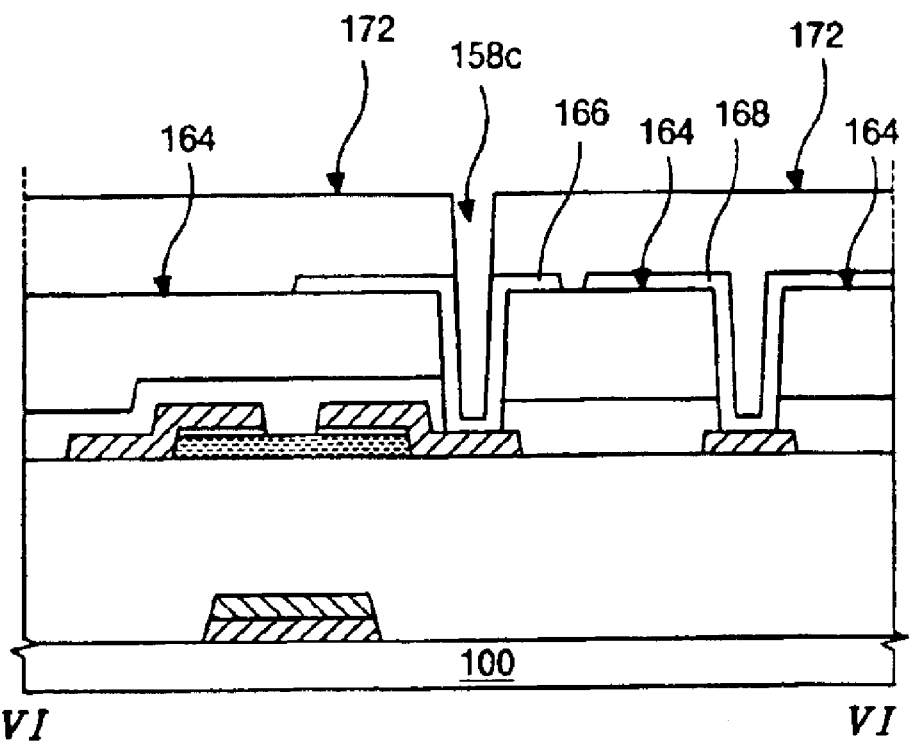

Referring to FIGS. 5 and 6H, the ground line 154 is under the capacitor electrode 168 and crosses the capacitor electrode 168, which acts as a first electrode of the storage capacitor "C." The capacitor electrode 168 should occupy at least more than half of the pixel region and does not overlap the data line 152.

Figure 7I:
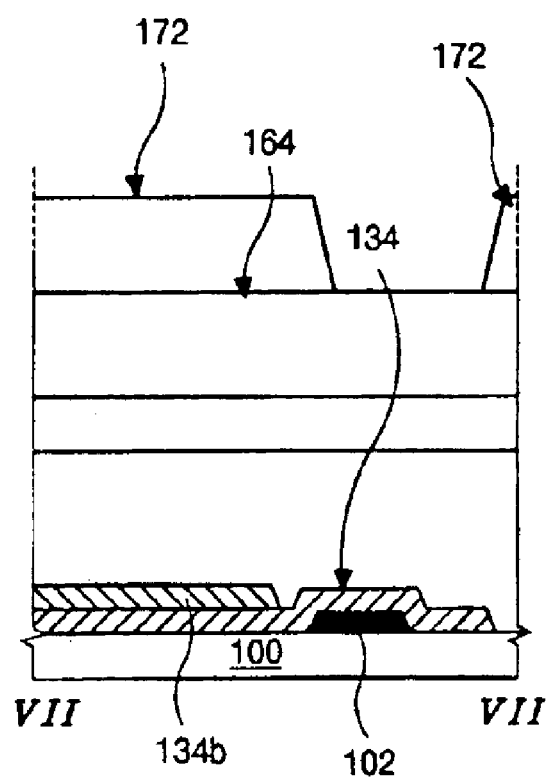
Figure 7J:
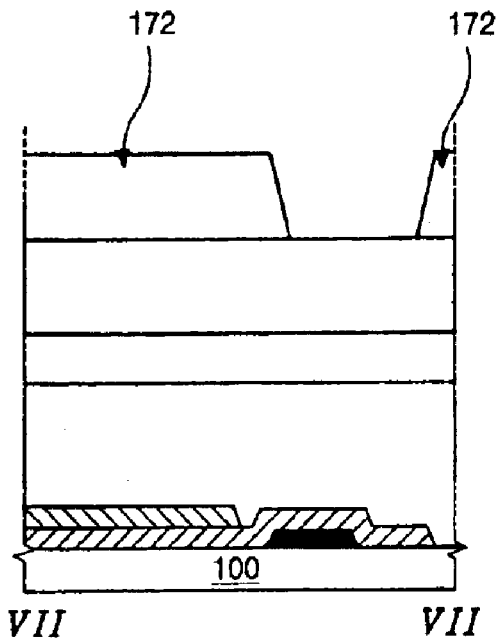
Figure 8I:
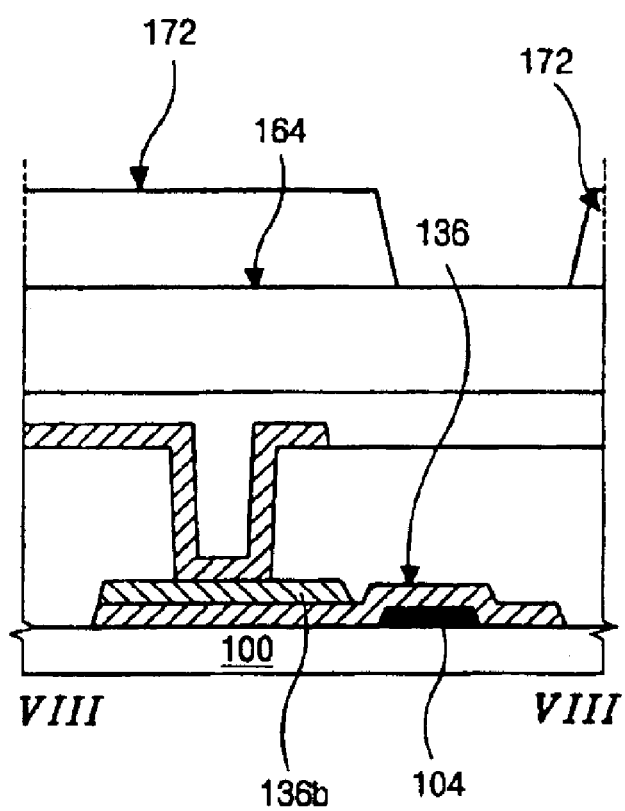
Figure 8J:
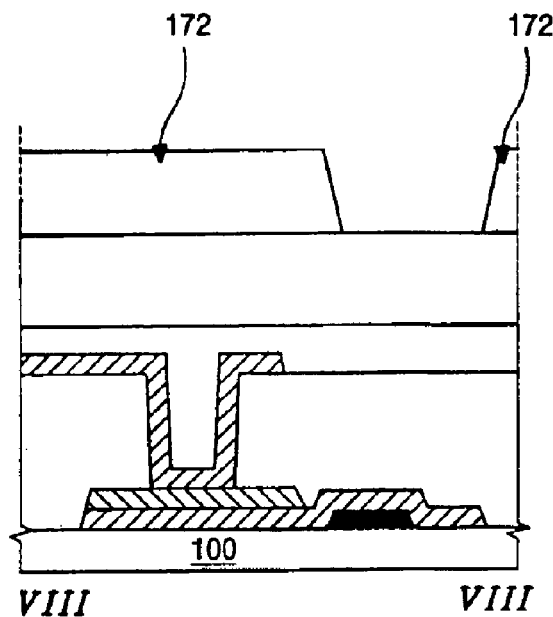
Figure 9I:
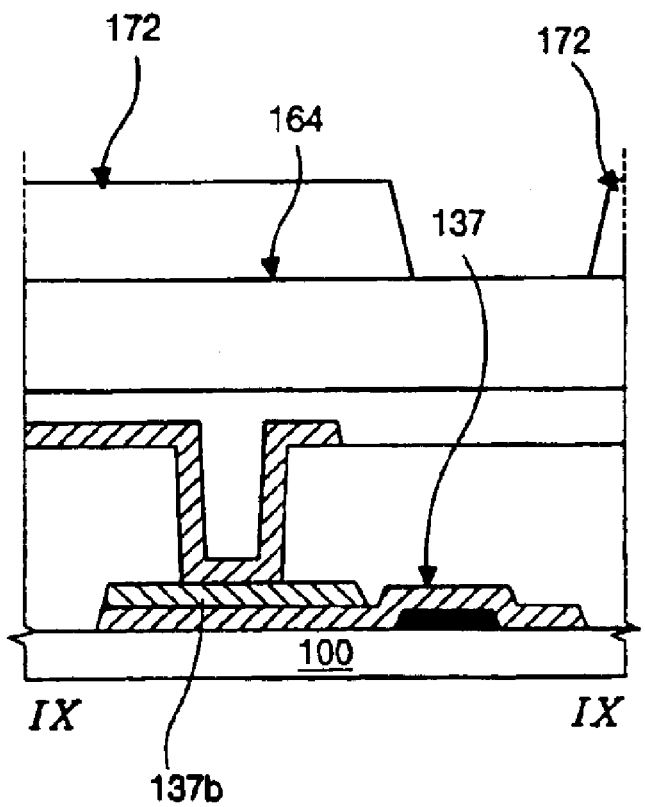
Figure 9J:
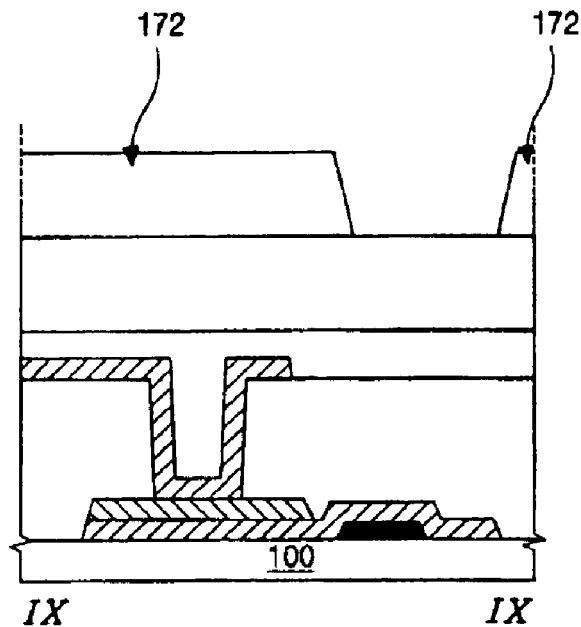

FIGS. 6I, 7I, 8I and 9I show a step of forming a third passivation layer 172. First, an organic material, such as benzocyclobutene (BCB) or acryl-based resin, is formed on the second passivation layer 164 to cover the auxiliary drain electrode 166 and the capacitor electrode 168, thereby forming the third passivation layer 172. After formed, the third passivation layer 172 is patterned to form a third drain contact hole 158c that exposes a portion of the auxiliary drain electrode 166. Due to the auxiliary drain electrode 166, the sidewall of first and second drain contact holes 158a and 158b and the drain electrode 150 are not damaged when forming the third drain contact hole 158c. At the time of forming the third drain contact hole 158c, portions of the third passivation layer 172, which respectively correspond to the gate buffer 102, the data buffer 104 and the ground buffer 105, is removed, as shown in FIGS. 7I, 8I and 9I.

Figure 6J:
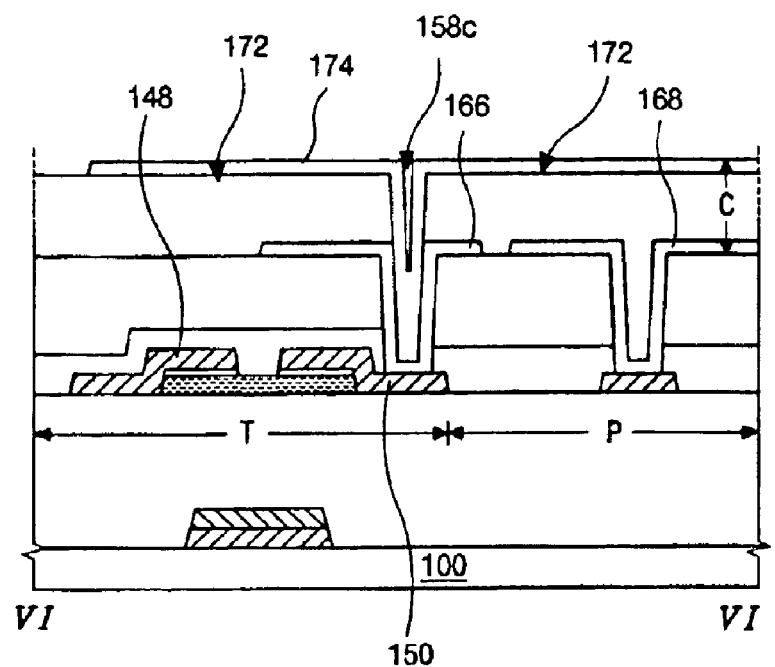
Figure 6K:
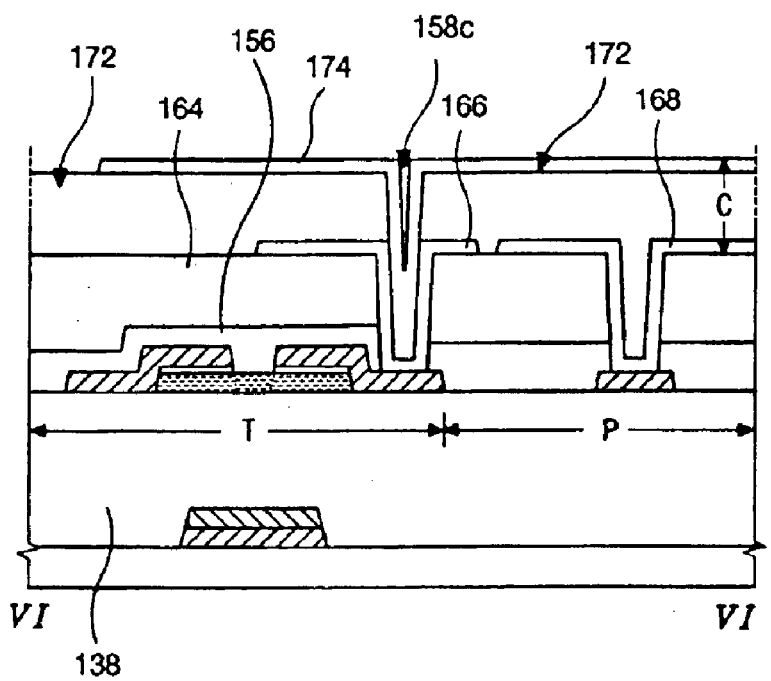

In FIGS. 6J, 7J, 8J and 9J, a transparent conductive material is deposited on the third passivation layer 172 and then patterned to form a pixel electrode 174. The pixel electrode 174 contacts the auxiliary drain electrode 166 through the third drain contact hole 158c, and acts as a second electrode of the storage capacitor "C." The pixel electrode 174 is positioned in the pixel region and extends over the source and drain electrodes 148 and 150 of the TFT. As shown in FIG. 6J, the pixel electrode 174 overlaps the capacitor electrode 168 to form the storage capacitor "C" with the interposed third passivation layer 172 as a dielectric layer. According to the principles of the present invention, the third passivation layer 172 interposed between the capacitor electrode 168 and the pixel electrode 174 has a relatively small thickness rather than the second passivation layer 164 and the planarizing protection layer 66 of FIG. 3D, thereby increasing the electric capacity of the storage capacitor "C."

Figure 7K:
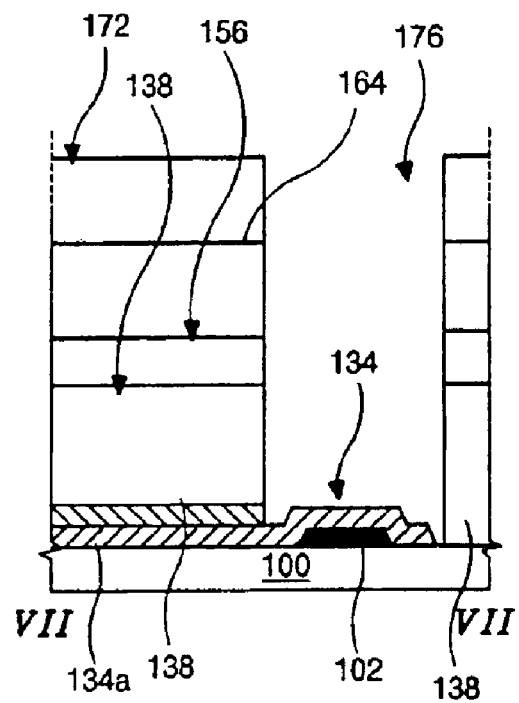
Figure 8K:
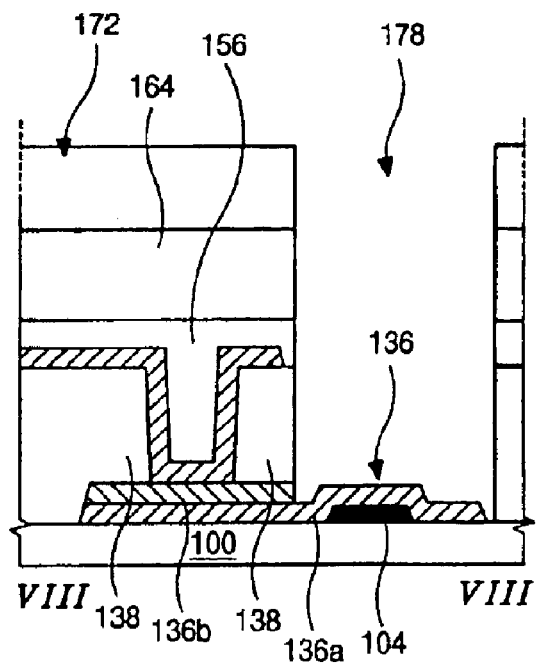
Figure 9K:
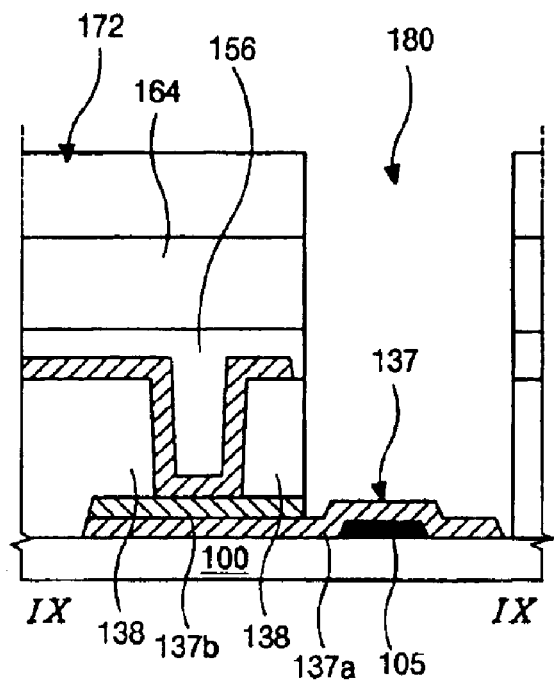

FIGS. 6K, 7K, 8K and 9K shows a step of exposing the gate pad 134 over the gate buffer 102, the data pad 136 over the data buffer 104 and the ground pad 137 over the ground buffer 105. As shown in FIGS. 7K, 8K and 9K, portions of the gate insulation layer 138 and the first and second passivation layers 156 and 164, which are over the buffers 102, 104 and 105, are etched. Therefore, a gate pad contact hole 176 is formed to expose the gate pad first layer 134a, a data pad contact hole 178 to a data pad first layer 136a, and the ground pad contact hole 180 to the ground pad first layer 137a.

Thereafter, although not shown in the drawings, a photoconductive film is formed on the pixel electrode 174. As described hereinbefore, the photoconductive film converts the external signals, particularly X-rays, into the electrical signals. The photoconductive film is beneficially comprised of an amorphous selenium compound that is deposited in a thickness of about 100 to about 500 micrometers ($\mu$m) by an evaporator. Furthermore, the photoconductive film can include, for example, $HgI_2$, $PbO_2$, CdTe, CdSe, Thallium Bromide or Cadmium Sulfide, all of which have low dark conductivity and high sensitivity to external signals, particularly X-rays. When the photoconductive film is exposed to the X-rays, electron-hole pairs are produced in the photoconductive film in accordance with the strength of the X-rays. If the X-rays are irradiated to the photoconductive film while an external voltage is applied to the conductive electrode formed on the photoconductive film, the electron-hole pairs separate into separate electrons and holes and either the electrons or the holes accumulate in the pixel electrode 174 as the electric charges. Therefore, the accumulated electric charges are stored in the storage capacitor "C" of FIG. 5.

In the above-mentioned array substrate for the X-ray detector, since the silicon insulator is formed on the TFT, the contact characteristics, between the silicon insulator and the active layer of the TFT, are improved. As a result, a carrier mobility of the active channel is improved. Furthermore, because the dielectric layer of the storage capacitor has a smaller thickness than the dielectric layer of the conventional device, the electric capacity of the storage capacitor is increased. Therefore, the external X-ray image display device can present clear images.

Figure 10:
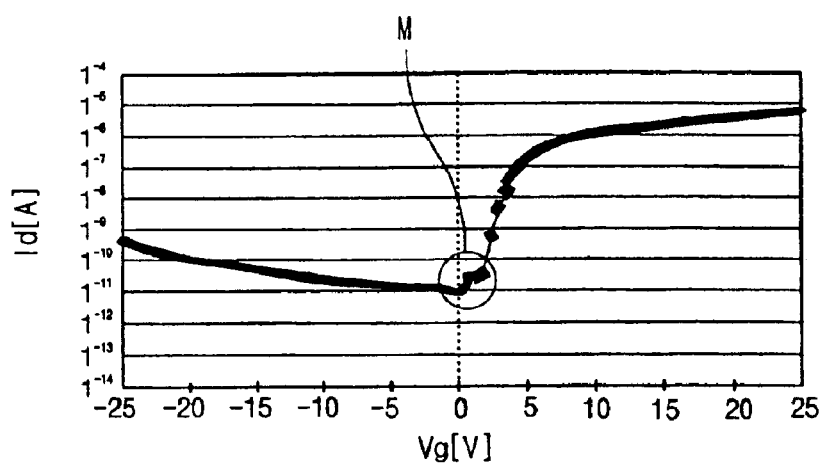
FIG. 10 is a graph showing the relation between gate voltage ($V_g$) and drain current ($I_d$) of the thin film transistor according to the principles of the present invention.

FIG. 10 is a graph showing the relation between gate voltage ($V_g$) and drain current ($I_d$) of the thin film transistor according to the principles of the present invention. The leakage current characteristics of an X-ray detector of the present invention are illustrated in the graph of FIG. 10. When the gate voltage $V_g$ of the TFT is 0V, the drain voltage $I_d$ is close to almost 0V as indicated "M," so the TFT can operates ideally.

Accordingly, the first embodiment of the present invention prevents the off current occurring in the active channel of the conventional device, thereby improving the operating characteristics of the TFT and helping to show clear images.

Figure 11:
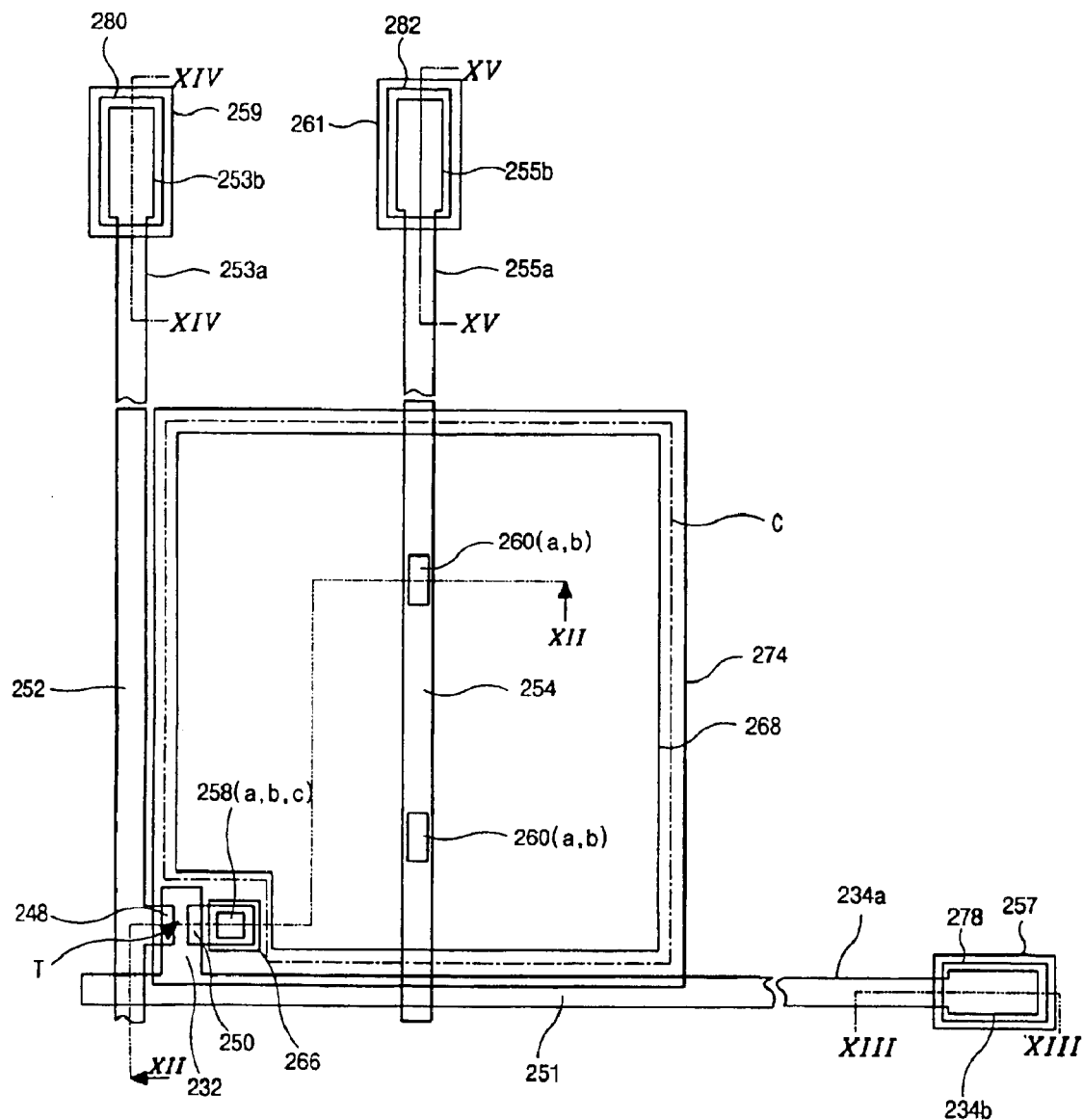
FIG. 11 is a partial schematic plan view of an array substrate for use in an X-ray detector that is in accord with a second embodiment of the principles of the present invention.

FIG. 11 is a partial schematic plan view of an array substrate for use in an X-ray detector that is in accord with a second embodiment of the principles of the present invention. The plan view of FIG. 11 is very similar to that of FIG. 5, but the second embodiment shown in FIG. 11 has differences in the gate, data and ground pads from the first embodiment.

As shown in FIG. 11, a gate line 251 and a data line 252 cross each other and define a pixel region. A gate pad 234b is formed at the end of the gate line 251 and connected to the gate line 251 through a gate linking line 234a. A data pad 253 is formed at the end of the data line 252 and connected to the data line 252 through a data linking line 253a. The linking lines 234a and 253a are located between a pad region where the gate and data pads 234b and 253b are disposed and the pixel region where the gate and data lines 251 and 252 are disposed. Therefore, the gate and data linking lines 234a and 253a electrically connect the gate and data pads 234b and 253b to the gate and data lines 251 and 252, respectively. A gate pad electrode 257 is on the gate pad 234b, and a data pad electrode 259 is on the data pad 253b. The gate pad electrode 257 and the data pad electrode 259 are associated with a gate pad contact hole 278 and a data pad contact hole 280, respectively. And thus, the gate pad contact hole 278 exposes a portion of the gate pad electrode 257 and the data pad contact hole 280 exposes a portion of the data pad electrode 259.

A thin film transistor (TFT) "T" acting as a switching element is positioned near the crossing of the gate line 251 and the data line 252, and a storage capacitor "C" is positioned in the pixel region. The TFT "T" includes a gate electrode 232, a source electrode 248 and a drain electrode 250, and the storage capacitor "C" includes a capacitor electrode 268 and a pixel electrode 274. The capacitor electrode 268 serves as a first electrode of the storage capacitor "C", whereas the pixel electrode 274 serves as a second electrode of the storage capacitor "C." Although not shown in FIG. 11, an inorganic material as a dielectric layer is interposed between the capacitor electrode 268 and the pixel electrode 274. The pixel electrode 274 extends over the TFT "T" in order to increase the electric capacity of the storage capacitor "C." Electric charges generated in a photoconductive film gather and accumulate in the pixel electrode 274.

Still referring to FIG. 11, a ground line 254 is arranged substantially perpendicular to the gate line 251, crossing across the pixel region and the storage capacitor "C". Here, the ground line 254 acts as a common line for neighboring pixels, and at least one ground line contact hole 260 through which the capacitor electrode 268 contacts the ground line 254 is formed on the ground line 254. A ground pad 255b is located at the end of the ground line 254 and connected to the ground line 254 through a ground linking line 255a. A ground pad electrode 261 is on the ground pad 255b that is associated with a ground pad contact hole 282. The ground pad contact hole 282 exposes a portion of the ground pad electrode 261. As like the gate and data linking lines 234a and 253a, the ground linking line 255a is located between the pad region and the pixel region, so that the ground linking line 255a connects the ground pad 255b to the ground line 254.

Furthermore, the pixel electrode 274 is electrically connected to the drain electrode 250 of the TFT "T" via a drain contact hole 258, so the electric charges stored in the storage capacitor "C" flow to the data line 252 when the TFT "T" operates. These charges transmitted to the data line 252 are then transferred to an external image display device to form X-ray images.

According to the second embodiment of the present invention, the data line 252, the data pad 253b, the ground line 254 and the ground pad 255b are all formed in the same plane, so that the pad electrodes 257, 259 and 261 are required and disposed on the pads 234b, 253b and 255b. Due to the pad electrodes 257, 259 and 261, the over-etching of the pads 234b, 253b and 255b is prevented. Additionally, the decrease of the manufacturing steps can be obtained. In the second embodiment, the insulators formed on the TFT and the capacitor electrode are silicon insulators, such as silicon nitride ($SiN_x$) and silicon oxide ($SiO_2$), and these insulators are formed using a low temperature deposition method at a temperature of about 230 degrees centigrade (□). If the silicon insulator is formed on the TFT, the operating characteristics of the TFT are improved because the silicon insulator has a good adhesion to the active layer. Further, if the insulator formed on the capacitor electrode is the silicon insulator, that insulator is not easily separated from the capacitor electrode. Namely, the separation between the capacitor electrode and the insulator is prevented.

FIGS. 12A to 12J, 13A to 13J, 14A to 14J and 15A to 15J are cross sectional views taken along lines XII—XII, XIII—XIII, XIV—XIV and XV—XV of FIG. 11, respectively, and help illustrate the manufacturing steps for the array substrate according to the second embodiment of the present invention.

The fabrication steps of the array substrate illustrated in FIG. 11 will be explained with reference to FIGS. 12A to 12J, 13A to 13J, 14A to 14J and 15A to 15J, which are cross-sectional views taken along lines XII—XII, XIII—XIII, XIV—XIV and XV—XV of FIG. 11, respectively.

FIGS. 12A, 13A, 14A and 15A depict a first mask process that forms the gate electrode 232 and the gate pad 234b, all of which have a double-layered structure. A first metal layer and a second metal layer are sequentially formed on the substrate 200 and then patterned to form the gate electrode 232, a gate line 251 (in FIG. 11), the gate linking line 234a and the gate pad 234, all of which have double-layered structures. The first metal layer is formed of Aluminum (Al) or Aluminum alloy (e.g., AlNd), while a second metal layer is formed of one of Chromium (Cr), Tungsten (W) and Molybdenum (Mo). On contrary to the first embodiment, the data pad and the ground pad are not formed in this step. As mentioned before, Aluminum (Al) or Aluminum alloy usually has low resistance and reduced signal delay. But Aluminum (Al) or Aluminum alloy is chemically weak when exposed to acidic processing and may result in formation of hillocks during processing. Accordingly, multi-layered aluminum structures, as shown in FIGS. 12A, 13A, 14A and 15A are used for the gate electrode 232, gate line 251 and gate pad 234b.

Referring to FIGS. 12B, 13B, 14B and 15B, a gate insulation layer 238 is formed on the substrate 200 to cover the gate electrode 232, the gate line 251 (in FIG. 11), the gate linking line 234a and the gate pad 34. The gate insulation layer 238 has a thickness ranging from about 100 to about 3000 angstroms (Å), and is an inorganic substance such as Silicon Nitride ($SiN_x$) or Silicon Oxide ($SiO_x$), or an organic substance such as BCB (Benzocyclobutene) or an acryl-based resin.

FIGS. 12C, 13C, 14C and 15C show a second mask process that forms an active layer 240 and an ohmic contact layer 242. First, a pure amorphous silicon (a-Si:H) layer and a doped amorphous silicon ($n^+$ a-Si:H) layer are then sequentially formed on the gate insulation layer 238 and then patterned to form the active layer 240 and the ohmic contact layer 242 over the gate electrode 232.

Figure 14A:
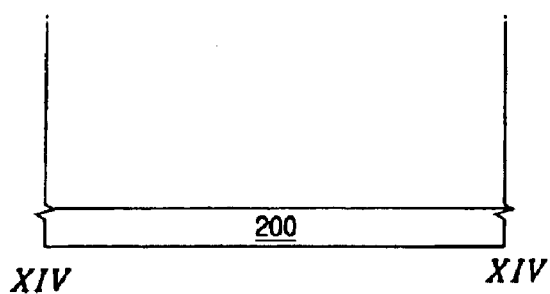
Figure 14B:
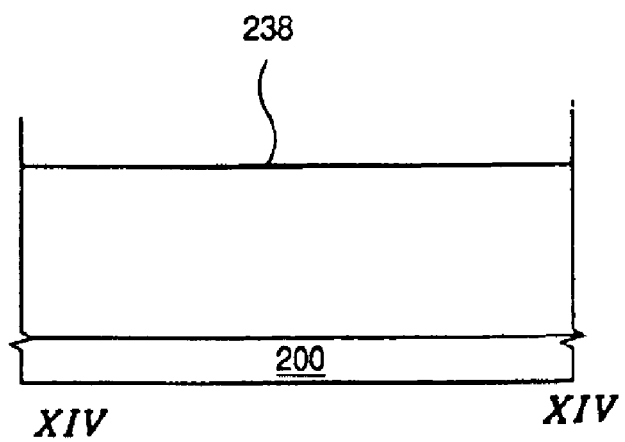
Figure 14C:
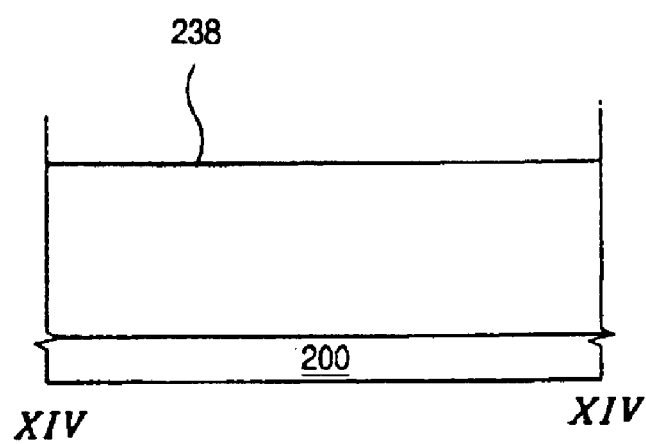
Figure 14D:
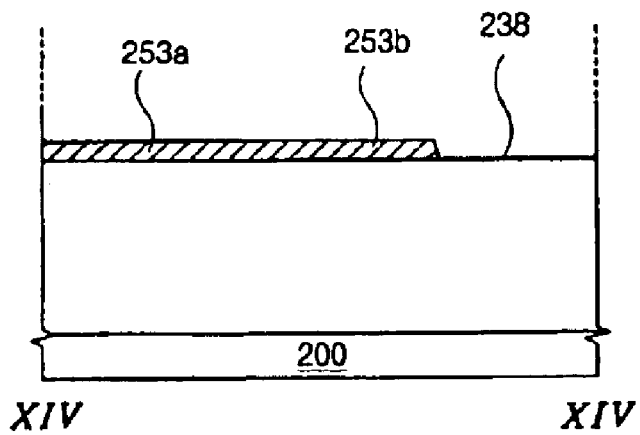
Figure 14E:
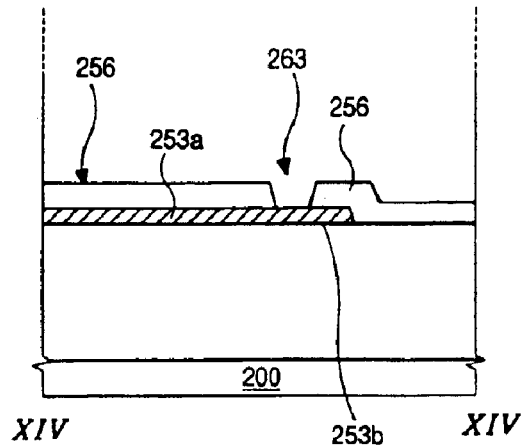
Figure 14F:
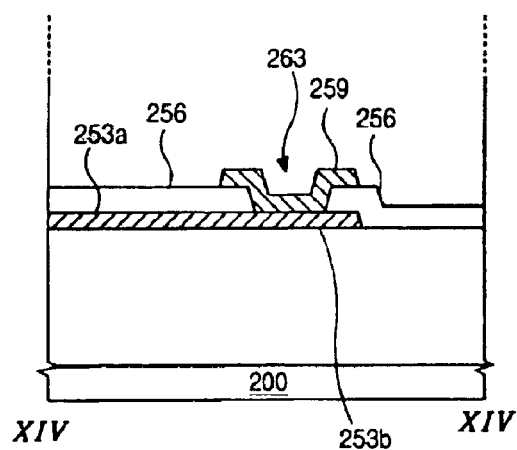
Figure 14G:
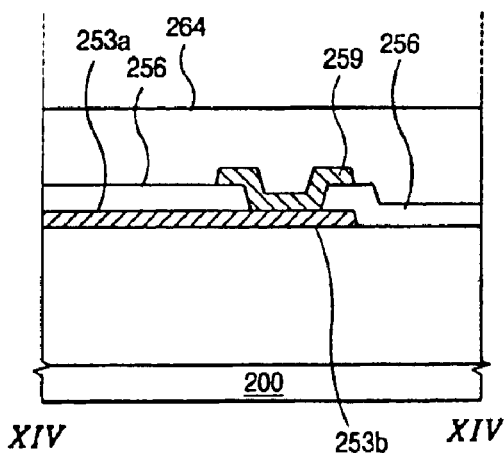
Figure 14H:
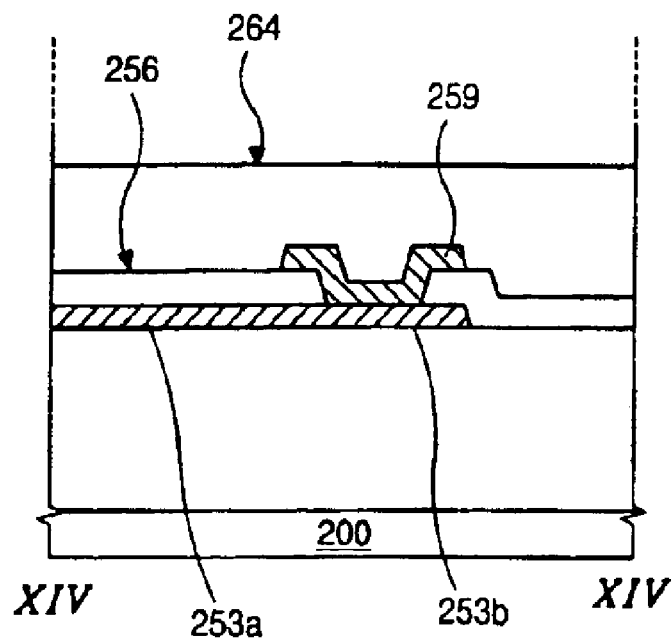
Figure 14I:
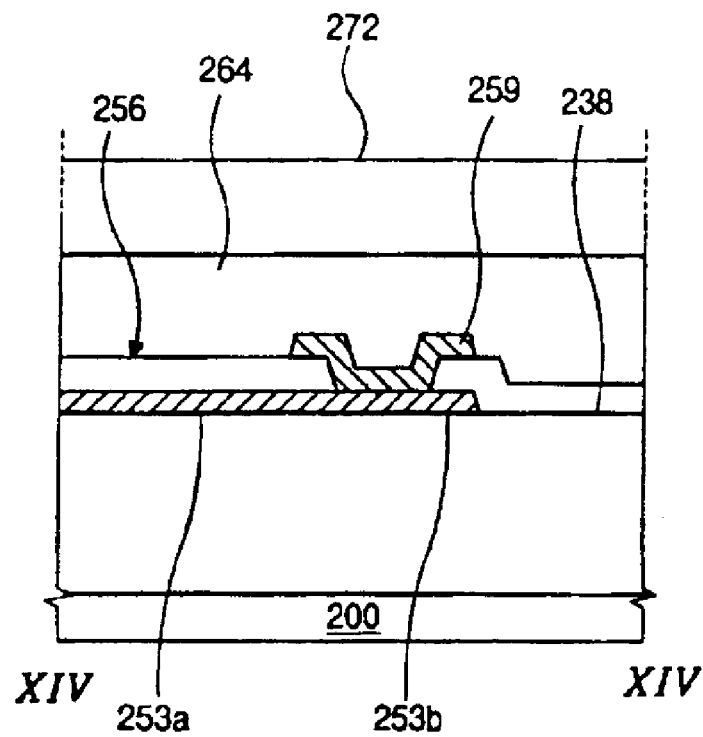
Figure 15A:
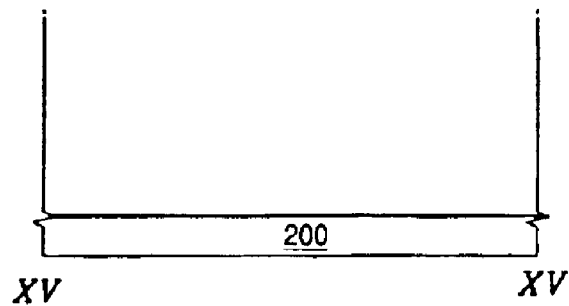
Figure 15B:
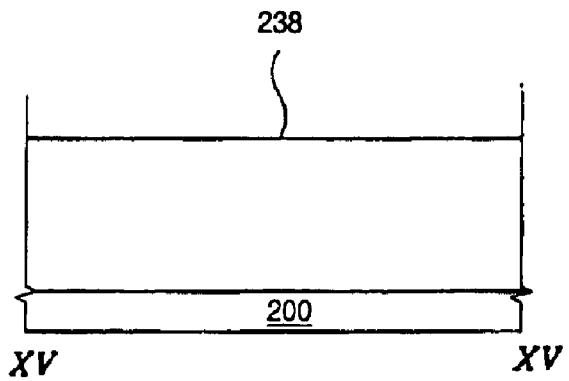
Figure 15C:
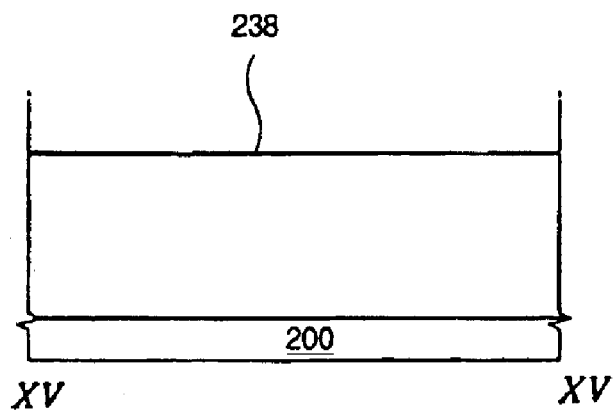
Figure 15D:
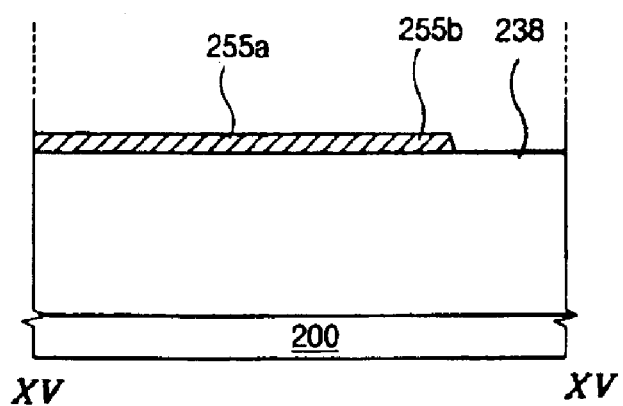
Figure 15E:
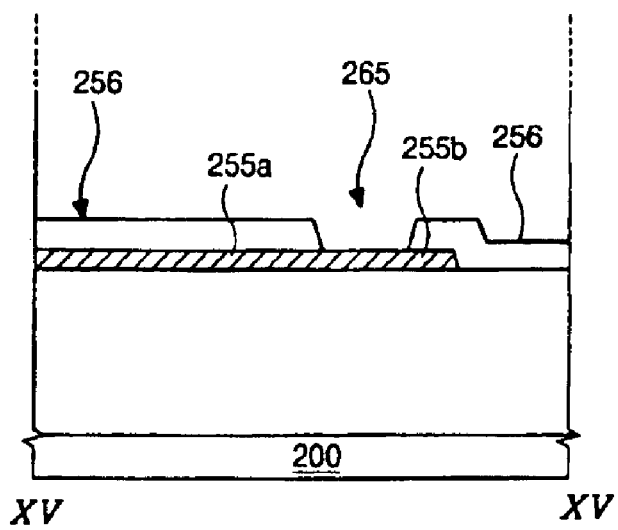
Figure 15F:
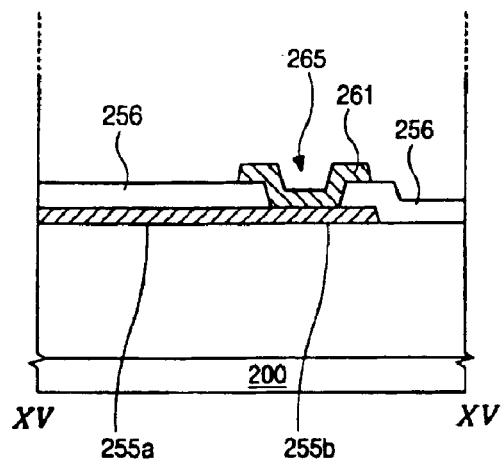
Figure 15G:
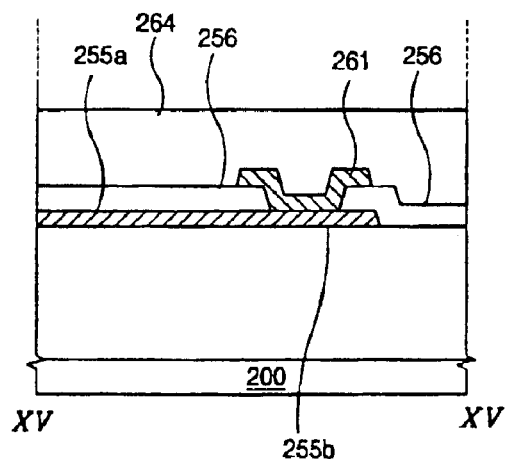
Figure 15H:
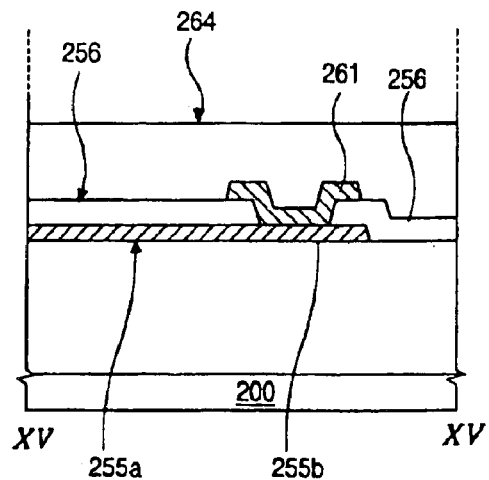
Figure 15I:
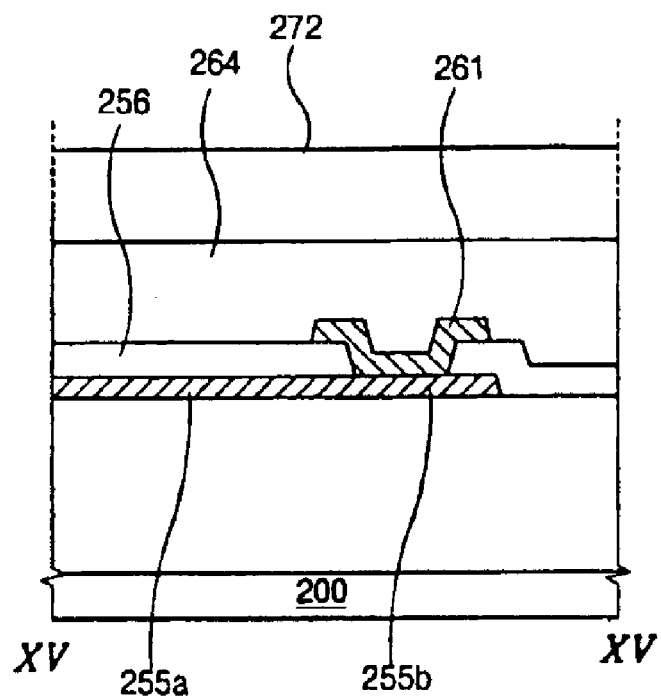

FIGS. 12D, 13D, 14D and 15D show a third mask process. In FIGS. 12D, 13D, 14D and 15D, a third metal layer is deposited on the gate insulation layer 238 to cover the ohmic contact layer 242, and then patterned to form a source electrode 248, a drain electrode 250, a data line 252 and a ground line 254. At this time of forming the source and drain electrodes 248 and 250, the data and ground linking line 253a and 255a and the data and ground pads 253b and 255b are also formed, as shown in FIGS. 14D and 15D. The third metal layer is formed of one of Aluminum (Al), Chromium (Cr), Molybdenum (Mo), Tungsten (W) and the like.

The source electrode 248 is formed on the ohmic contact layer 242 and over the gate electrode 232 as an extension of the data line 252. The drain electrode 250 is also formed on the ohmic contact layer 242 and over the gate electrode 232 and spaced apart from the source electrode 248. As shown in FIG. 11, the ground line 254 is parallel with the data line 252 and crosses the pixel region defined by a pair of gate line 251 and data line 252. The end of the data line 252 is connected to the data linking line 253a that is connected to the data pad 253b, and the end of the ground line 254 is connected to the ground linking line 255a that is connected to the ground pad 255b. Compared to the first embodiment shown in FIG. 5, the direct connections between the data line 252 and the data pad 253b and between the ground line 254 and the ground pad 255b are accomplished. After patterning the third metal layer, a portion of the ohmic contact layer 242 on the active layer 240 is then etched to form a channel region using the source and drain electrodes 248 and 250 as masks. Thus, the TFT "T" (see FIG. 11) is completed.

FIGS. 12E, 13E, 14E and 15E show a fourth mask process and a step of forming a first passivation layer 256 on the gate insulation layer 238 to cover the patterned third metal layer. The first passivation layer 256 is formed by depositing a silicon insulator (e.g., silicon nitride ($SiN_x$) or silicon oxide ($SiN_2$)) by a thickness of about 500 to about 1300 angstroms (Å). Because the silicon insulator has a superior adhesive strength to the active layer 140, the trap state density is decreased in the interface between the active layer 240 and the first passivation layer 256. Therefore, the area trapping the electric charges is reduced and the electron mobility increases. It is also possible to prevent the leakage current characteristics that are presented by direct-contacting the organic material (e.g., BCB) to the active layer 240. Referring to FIGS. 12E, 13E, 14E and 15E, the first passivation layer 256 is patterned using the fourth mask to form a first drain contact hole 258a, a first ground line contact hole 260a, a first gate pad contact hole 262, a first data pad contact hole 263 and a first ground pad contact hole 265. The first drain contact hole 258a exposes a portion of the drain electrode 150 and the first ground line contact hole 260a exposes a portion of the ground line 254. The first gate pad contact hole 261 penetrates both the gate insulation layer 238 and the first passivation layer 256 such that a portion of the gate pad 234b is exposed by the first gate pad contact hole 262. The first data pad contact hole 263 and the first ground pad contact hole 265 expose the data pad 253a and the ground pad 255b, respectively.

FIGS. 12F, 13F, 14F and 15F are cross-sectional views showing a fifth mask process of forming pad electrodes 257, 259 and 261. Aluminum (Al) or Aluminum alloy (e.g., AlNd) that has low resistance is formed on the first passivation layer 256 and then patterned to form the gate pad electrode 257, the data pad electrode 259 and the ground pad electrode 261. The gate pad electrode 257 contacts the gate pad 234b through the first gate pad contact hole 262, the data pad electrode 259 to the data pad 253b through the first data pad contact hole 263, and the ground pad electrode 261 to the ground pad 255b through the ground pad contact hole 265. Although not shown in FIG. 12F, an auxiliary drain electrode that contacts the drain electrode 250 through the first drain contact hole can be formed when forming the pad electrodes 257, 259 and 261.

FIGS. 12G, 13G, 14G and 15G shows a sixth mask process. An organic material, such as benzocyclobutene (BCB) or acryl-based resin, is formed on the first passivation layer 256 to cover the pad electrodes 257, 259 and 261, thereby forming the second passivation layer 264. That organic material acts as not only a passivation layer but also a planarizing layer. Namely, although the TFT region is higher than the pixel region, the second passivation layer 164 makes the surface of substrate planar because the second passivation layer 264 is formed of the organic material such as benzocyclobutene (BCB) or acryl-based resin. The second passivation layer 264 is then etched to form a second drain contact hole 258b and a second ground line contact hole 160b. The second drain contact hole 258b corresponds to the first drain contact hole 258a of FIG. 12F, and also exposes the portion of the drain electrode 250. Further, the second ground line contact hole 260b corresponds to the first ground line contact hole 260a, and also exposes the portion of the ground line 254.

In contrast to the above-mentioned processes, the first and second drain contact holes 258a and 258b can be formed in the same mask process. Further, the first and second ground line contact holes 260a and 260b can also be formed by the same mask process.

FIGS. 12H, 13H, 14H and 15H show a seventh mask process that forms a auxiliary drain electrode 266 and a capacitor electrode 268. A transparent conductive material, such as ITO (indium tin oxide) or IZO (indium zinc oxide), is formed on the second passivation layer 264 and then patterned using the seventh mask to form the auxiliary drain electrode 266 and the capacitor electrode 268. The auxiliary drain electrode 266 contacts the drain electrode 250 through the drain contact hole 258 and is spaced apart from the capacitor electrode 268. The capacitor electrode 268 contacts the ground line 254 through the ground line contact hole 260 and is positioned in the pixel region as shown in FIG. 11.

Figure 12A:
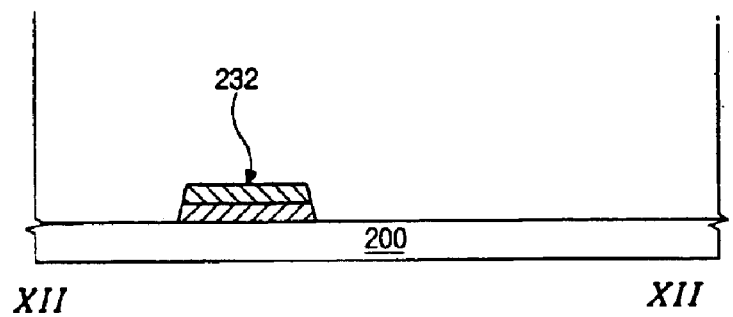
FIGS. 12A to 12J, 13A to 13J, 14A to 14J and 15A to 15J are cross sectional views taken along lines XII—XII, XIII—XIII, XIV—XIV and XV—XV of FIG. 11, respectively, and help illustrate the manufacturing steps for the array substrate according to the second embodiment of the present invention.
Figure 12B:
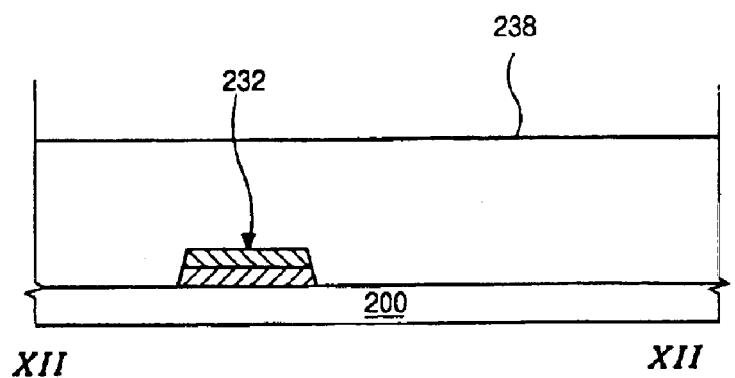
Figure 12C:
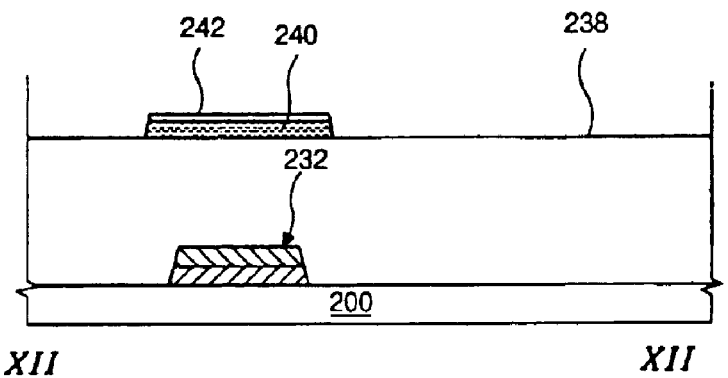
Figure 12D:
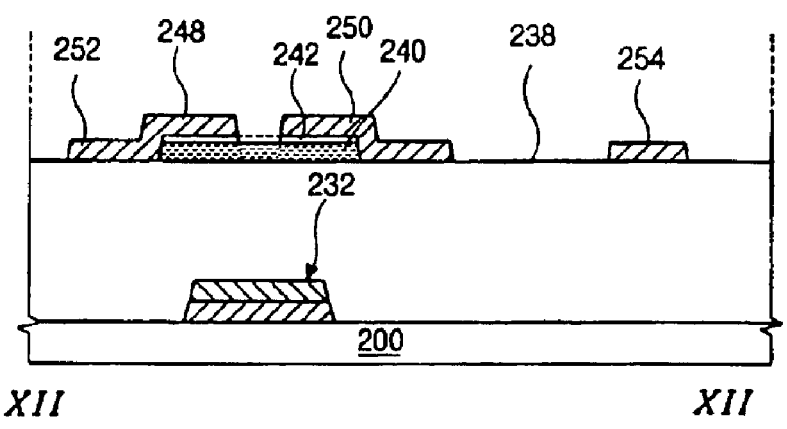
Figure 12E:
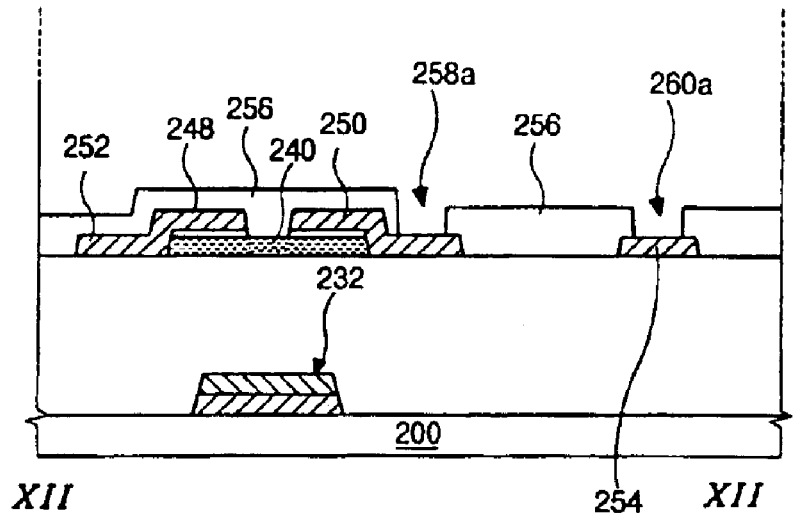
Figure 12F:
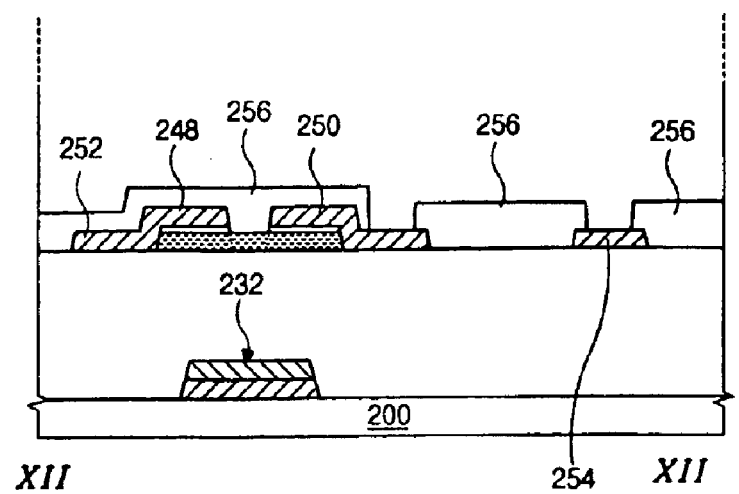
Figure 12G:
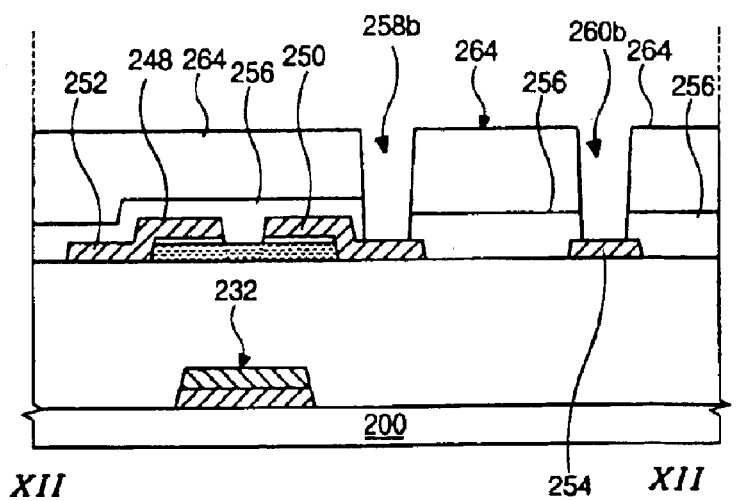
Figure 12H:
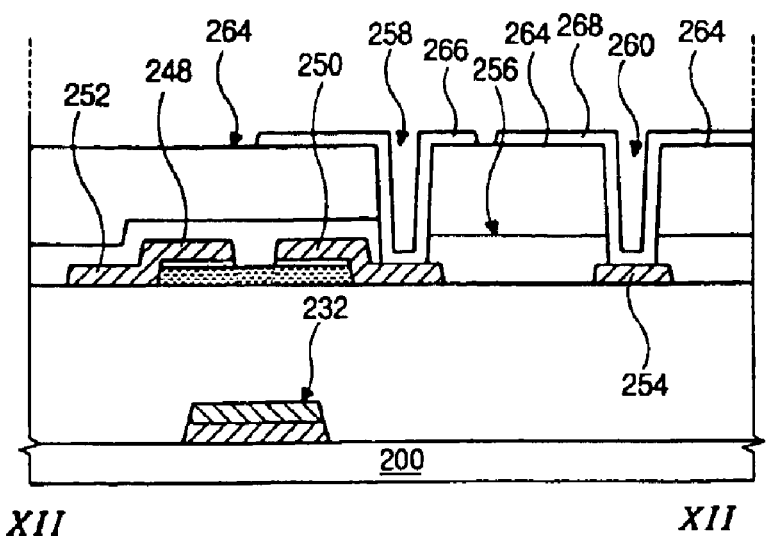
Figure 12I:
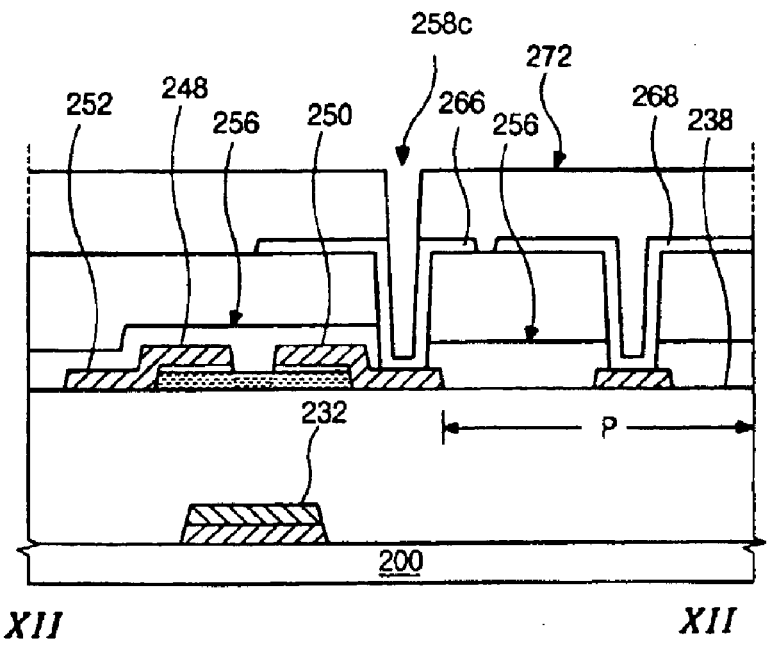

Referring to FIGS. 11 and 12H, the ground line 254 is under the capacitor electrode 268 and crosses the capacitor electrode 268, which acts as a first electrode of the storage capacitor "C." The capacitor electrode 268 should occupy at least more than half of the pixel region and does not overlap the data line 252.

FIGS. 12I, 13I, 14I and 15I show a eighth mask process and a step of forming a third passivation layer 272. A silicon insulator, such as silicon nitride ($SiN_x$) or silicon oxide ($SiO_2$), is formed on the second passivation layer 264 to cover the auxiliary drain electrode 266 and the capacitor electrode 268, thereby forming the third passivation layer 272. After formed, the third passivation layer 272 is patterned using the eighth mask to form a third drain contact hole 258c that exposes a portion of the auxiliary drain electrode 266. Due to the auxiliary drain electrode 266, the sidewall of first and second drain contact holes 258a and 258b and the drain electrode 250 are not damaged when forming the third drain contact hole 258c.

Figure 12J:
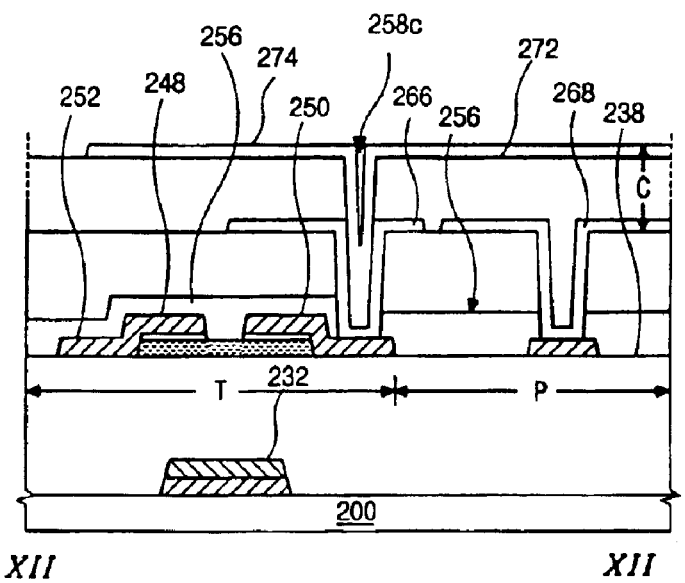

FIGS. 12J, 13J, 14J and 15J show a ninth mask process and a tenth mask process. A transparent conductive material is deposited on the third passivation layer 272 and then patterned using the ninth mask to form a pixel electrode 274. The pixel electrode 274 contacts the auxiliary drain electrode 266 through the third drain contact hole 258c, and acts as a second electrode of the storage capacitor "C." The pixel electrode 274 is positioned in the pixel region and extends over the source and drain electrodes 248 and 250 of the TFT. As shown in FIG. 12J, the pixel electrode 274 overlaps the capacitor electrode 268 to form the storage capacitor "C" with the interposed third passivation layer 272 as a dielectric layer.

Figure 1:
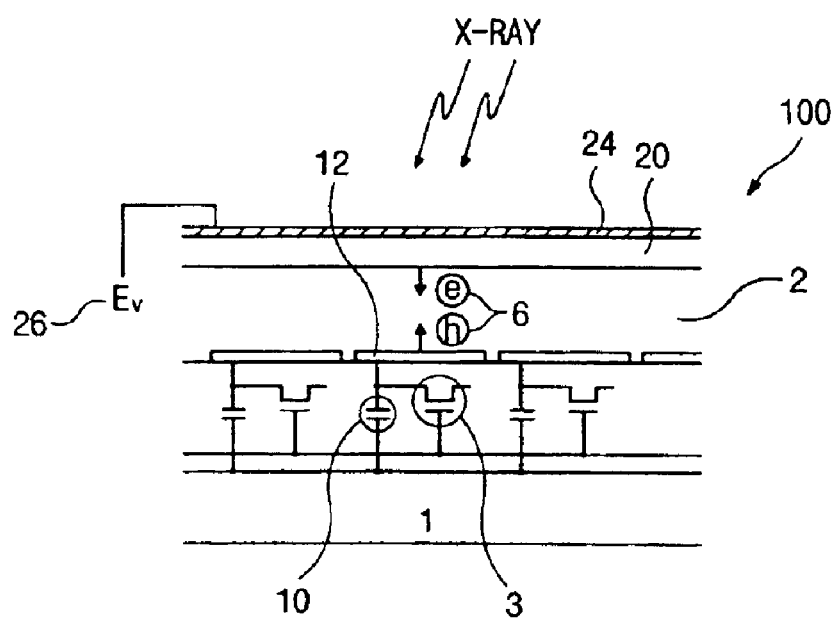
FIG. 1 is a schematic cross-sectional view illustrating the structure and operation of an X-ray detector according to a conventional art.
Figure 2:
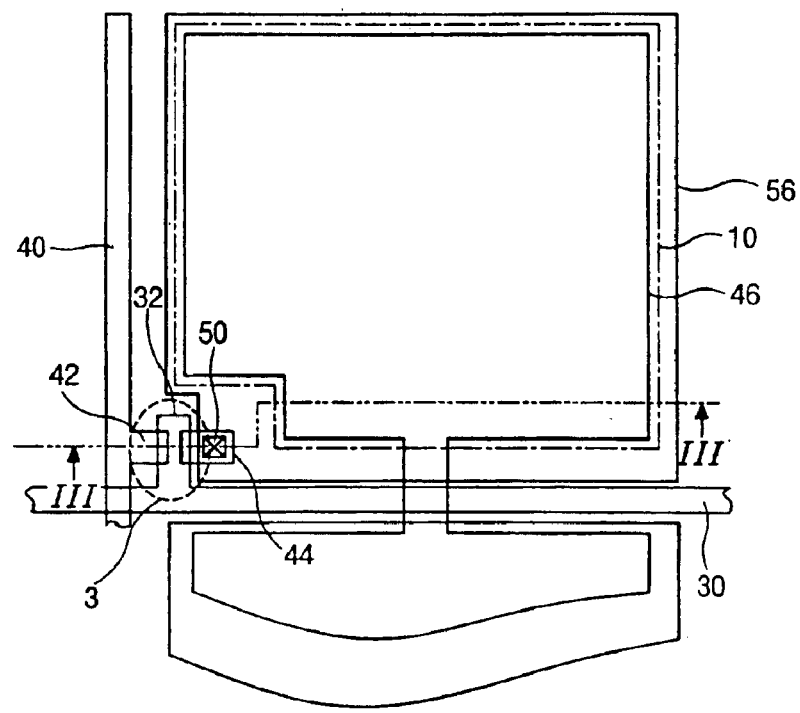
FIG. 2 is a plan view illustrating one pixel of an array substrate for an X-ray detector according to the conventional art.
Figure 3A:
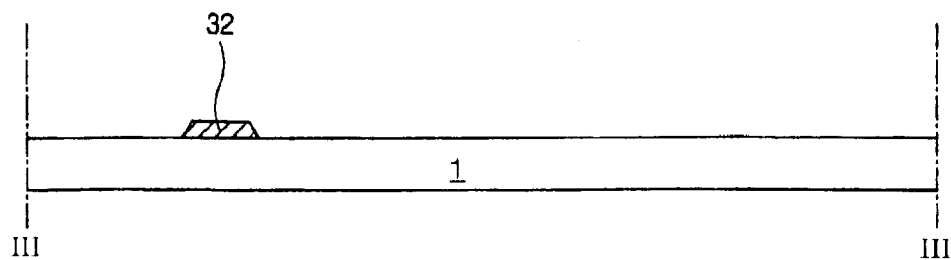
FIGS. 3A to 3G are cross-sectional views taken along line III—III of FIG. 2 and help to illustrate the manufacturing steps for the array substrate of the conventional art.
Figure 3B:
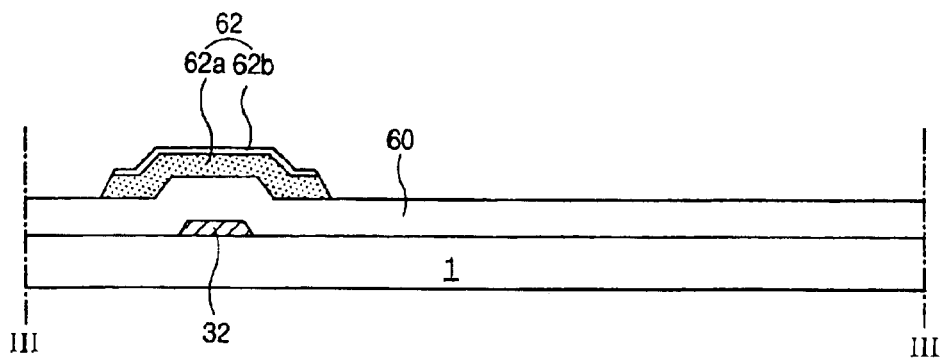
Figure 3C:
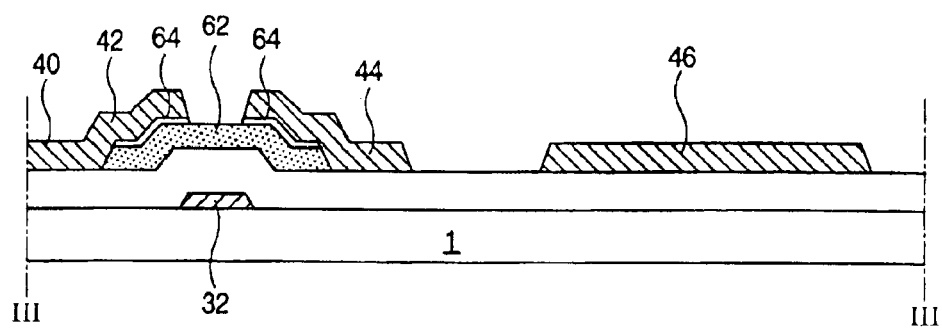
Figure 3D:
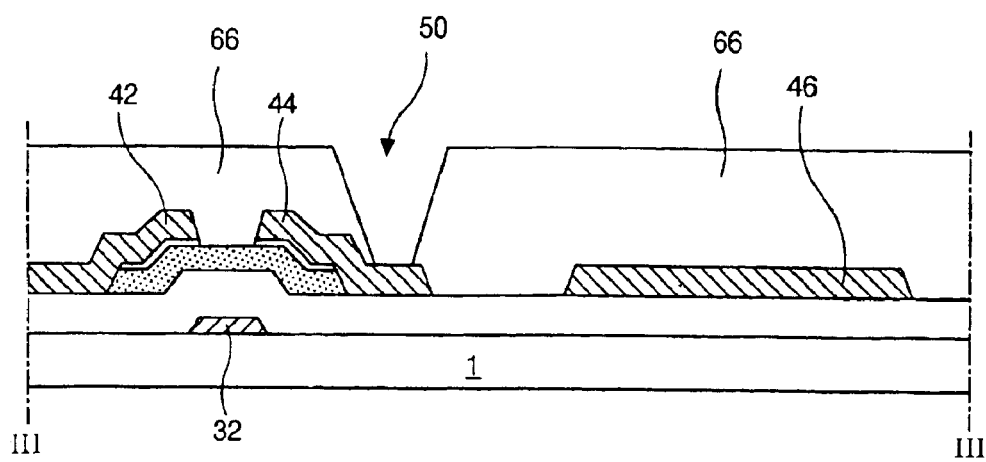
Figure 3E:
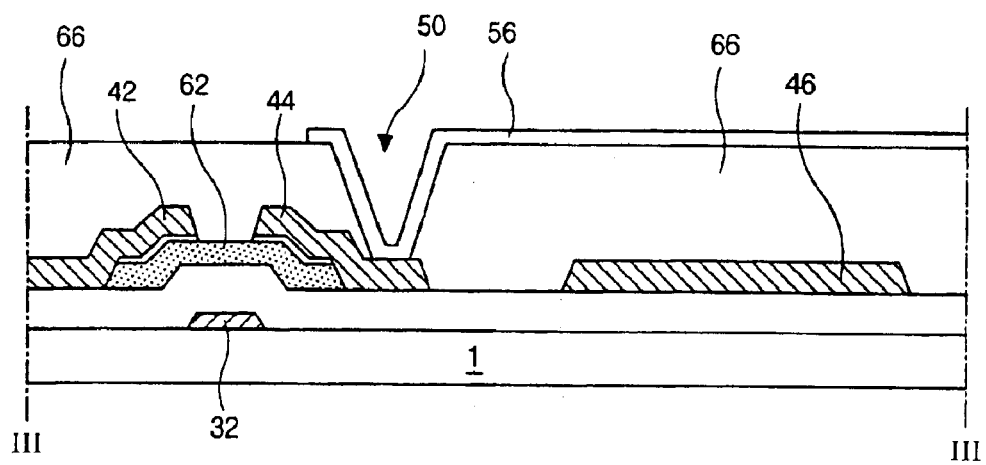
Figure 3F:
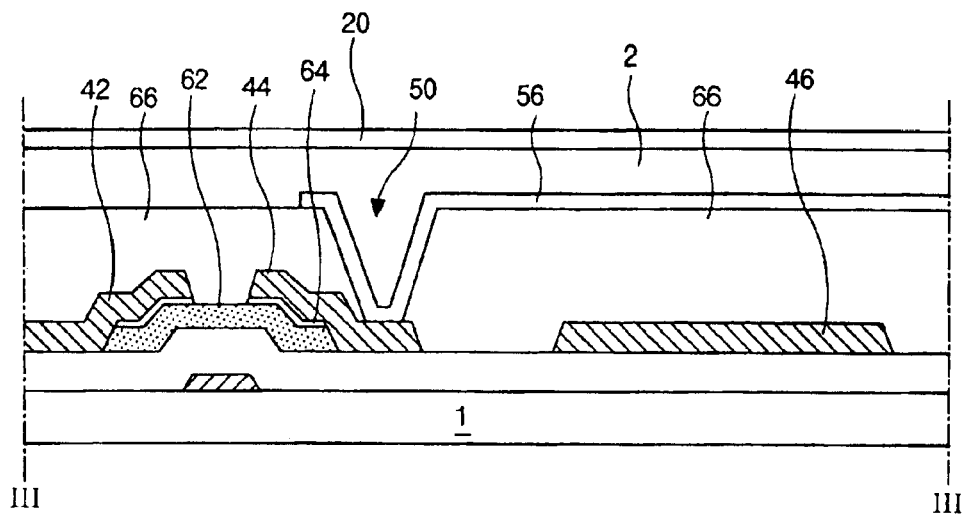
Figure 3G:
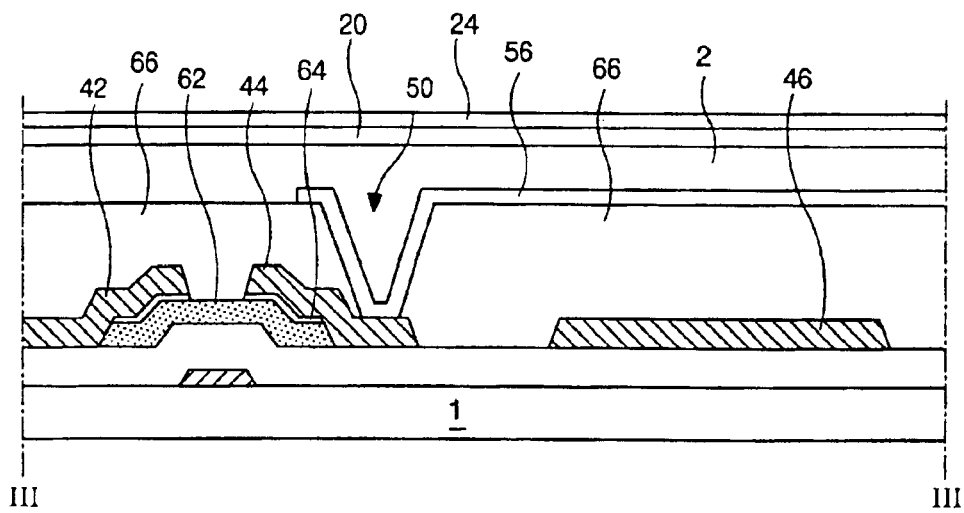
Figure 4:
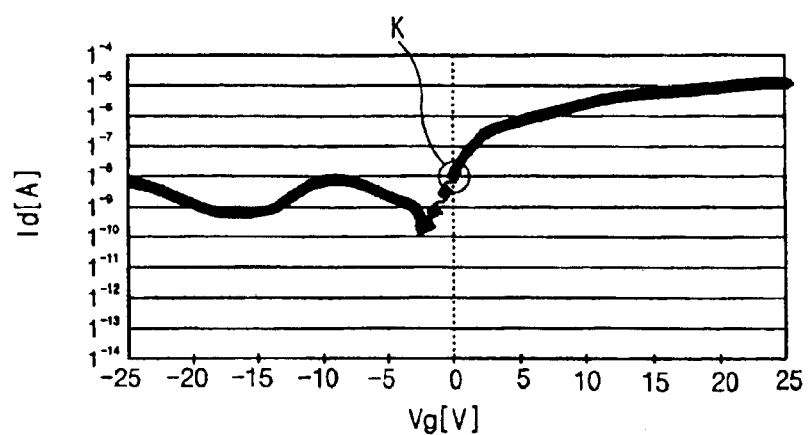
FIG. 4 is a graph showing the relation between gate voltage ($V_g$) and drain current ($I_d$) of the thin film transistor according to the conventional X-ray detector.

According to the second embodiment of the present invention, the third passivation layer 272 interposed between the capacitor electrode 268 and the pixel electrode 274 is an inorganic material (silicon nitride or silicon oxide) and has a relatively small thickness rather than the second passivation layer 264 and the planarizing protection layer 66 of FIG. 3D, thereby increasing the electric capacity of the storage capacitor "C."

Figure 13A:
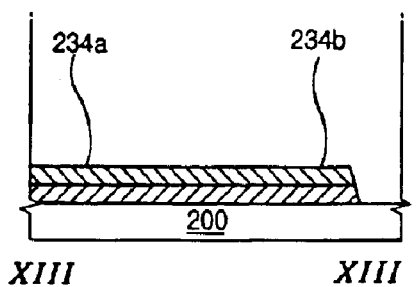
Figure 13B:
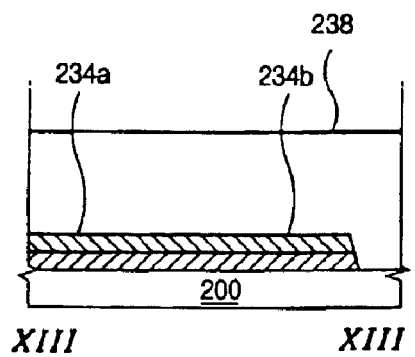
Figure 13C:
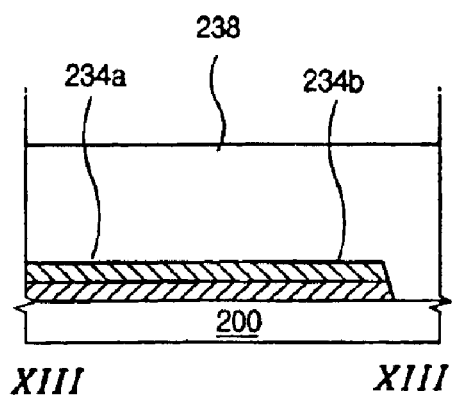
Figure 13D:
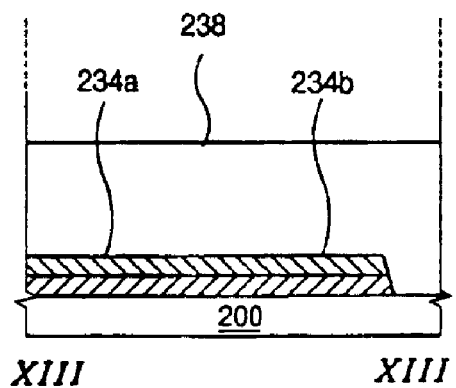
Figure 13E:
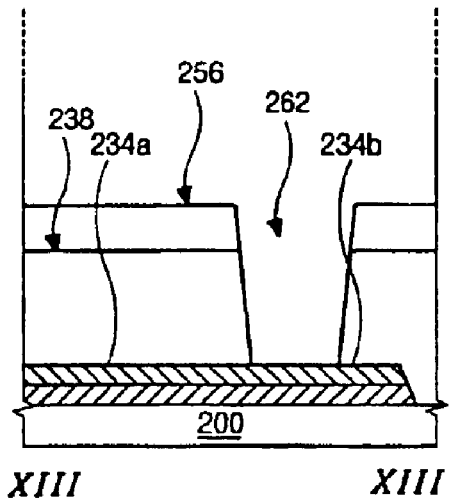
Figure 13F:
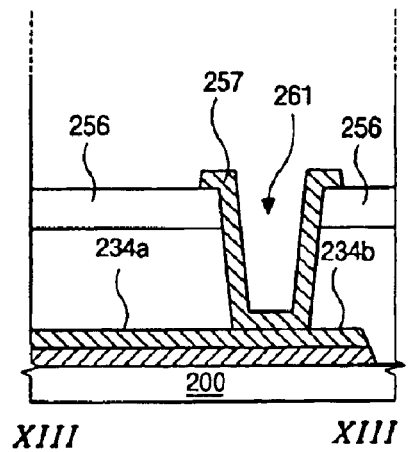
Figure 13G:
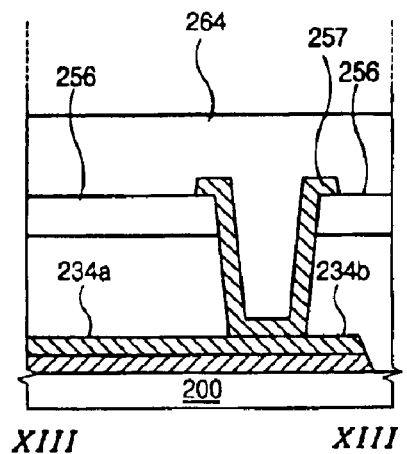
Figure 13H:
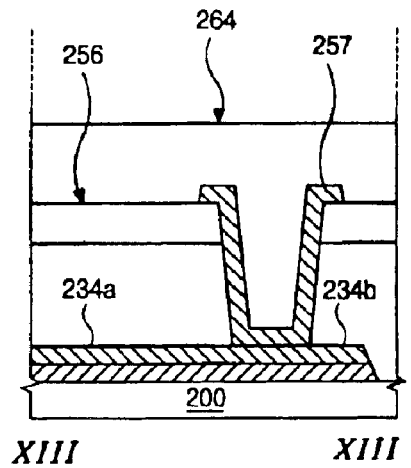
Figure 13I:
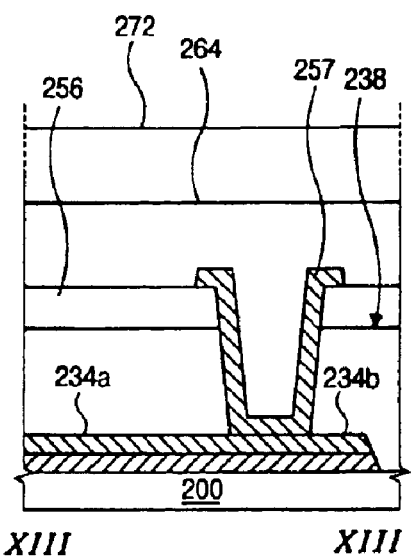
Figure 13J:
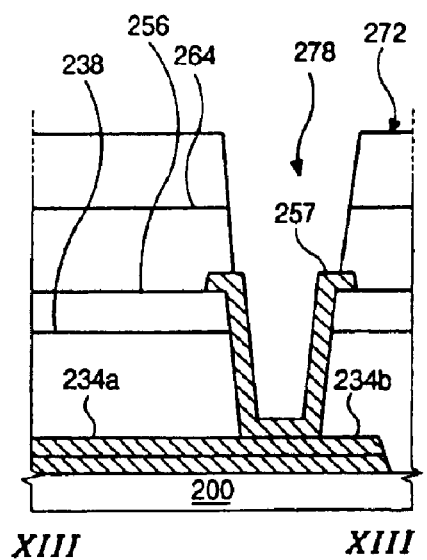
Figure 14J:
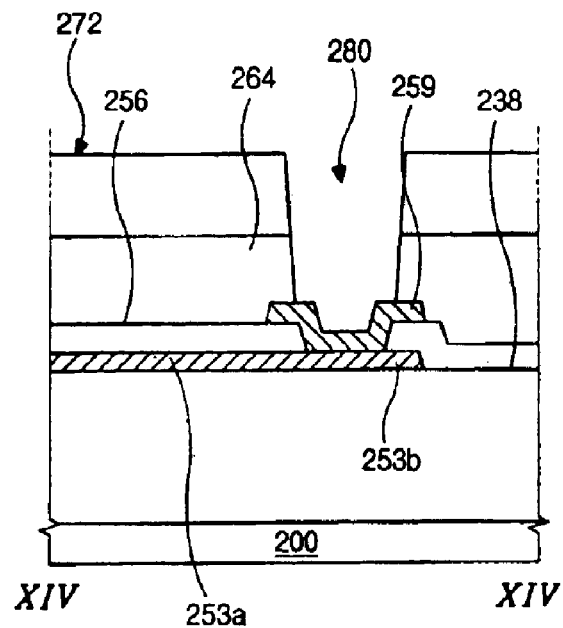
Figure 15J:
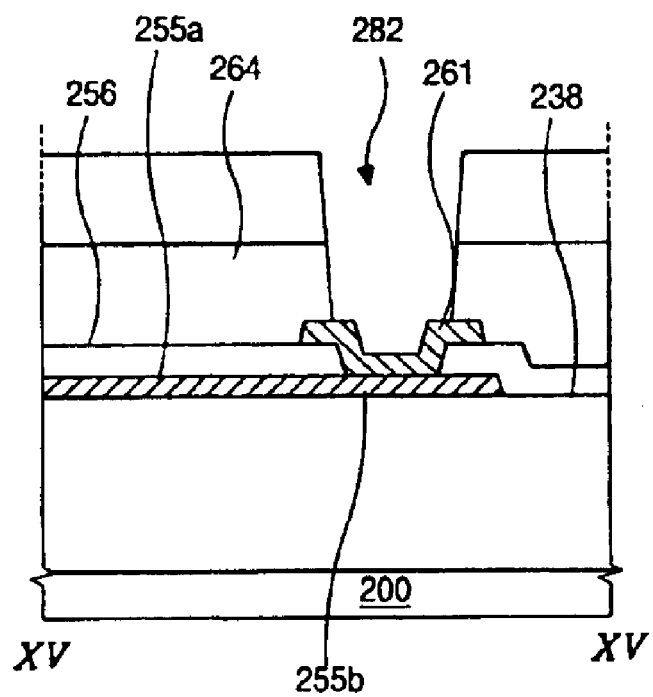

As shown in FIGS. 13J, 14J and 15J, portions of the second and third passivation layers 264 and 272, which are over the pad electrodes 257, 259 and 261, are etched using the tenth mask. Therefore, a gate pad contact hole 278 is formed to expose the gate pad electrode 257, a data pad contact hole 280 to a data pad electrode 259, and the ground pad contact hole 282 to the ground pad electrode 261.

Thereafter, although not shown in the drawings, a photoconductive film is formed on the pixel electrode 274. As described hereinbefore, the photoconductive film converts the external signals, particularly X-rays, into the electrical signals. The photoconductive film is beneficially comprised of an amorphous selenium compound that is deposited in a thickness of about 100 to about 500 micrometers ($\mu$m) by an evaporator. Furthermore, the photoconductive film can include, for example, $HgI_2$, $PbO_2$, CdTe, CdSe, Thallium Bromide or Cadmium Sulfide, all of which have low dark conductivity and high sensitivity to external signals, particularly X-rays. When the photoconductive film is exposed to the X-rays, electron-hole pairs are produced in the photoconductive film in accordance with the strength of the X-rays. If the X-rays are irradiated to the photoconductive film while an external voltage is applied to the conductive electrode formed on the photoconductive film, the electron-hole pairs separate into separate electrons and holes and either the electrons or the holes accumulate in the pixel electrode 274 as the electric charges. Therefore, the accumulated electric charges are stored in the storage capacitor "C" of FIG. 11.

In the second embodiment of the present invention, the first and third passivation layers 256 and 272 are both formed of the silicon insulator, such as silicon nitride or silicon oxide under the low temperature process at a temperature of about 230 degrees centigrade (° C.). Therefore, the adhesion strength of the insulator further increases and the third passivation layer 272 is not easily separated from the capacitor electrode 268. Moreover, since the silicon insulator is formed on the TFT using the low temperature process at a temperature of about 230 degrees centigrade (° C.), the contact characteristics, between the silicon insulator and the active layer of the TFT, are further improved. As a result, a carrier mobility of the active channel is improved. Furthermore, because the third passivation layer as the dielectric layer of the storage capacitor has a smaller thickness than the dielectric layer of the conventional device, the electric capacity of the storage capacitor is increased. Therefore, the external X-ray image display device can present clear images. According to the second embodiment, since the gate, data and ground pad electrodes are respectively formed to the gate, data and ground pads, the manufacturing process steps can be reduced and the contact characteristics of each pad can be improved.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. An array substrate for X-ray detector, comprising:
   a substrate having a switching region and a pixel region;
   a gate line on a substrate, the gate line having a gate linking line and a gate pad at the end thereof;
   a gate insulation layer on said gate line;
   a data line on said gate insulation layer, the data line perpendicularly crossing said gate line to define the pixel region and having a data linking line and a data pad at the end thereof;
   a thin film transistor in the switching region near the crossing of the said gate and data lines, the thin film transistor including a gate electrode, an active layer, a source electrode, a drain electrode and said gate insulation layer;
   a ground line crossing said pixel region parallel with the data line and having a ground linking line and a ground pad at the end thereof;
   a first passivation layer formed of a silicon insulator, the first passivation layer covering said thin film transistor and having a first drain contact hole that exposes the drain electrode and a first ground line contact hole that exposes the ground line;
   a gate pad electrode formed on the first passivation layer, the gate pad electrode contacting the gate pad through a first gate pad contact hole that penetrates both the gate insulation layer and the first passivation layer;
   a data pad electrode formed on the first passivation layer, the data pad electrodes contacting the data pad though a first data pad contact hole that penetrates the first passivation layer;
   a ground pad electrode formed on the first passivation layer, the ground pad electrode contacting the ground pad though a first ground pad contact hole that penetrates the first passivation layer;
   a second passivation layer formed of an organic material on the first passivation layer, the second passivation layer covering the gate pad electrode, the data pad electrode and the ground pad electrode, and having a second drain contact hole that exposes the drain electrode and a second ground line contact hole that exposes the ground line;
   a first capacitor electrode on the second passivation layer, the first capacitor electrode contacting the ground line through said first and second ground line contact holes;
   an auxiliary drain electrode on the second passivation layer, the auxiliary drain electrode contacting the drain electrode through said first and second drain contact holes;
   a third passivation layer on the second passivation layer, the third passivation layer covering the auxiliary drain electrode and the first capacitor electrode, and having an auxiliary drain contact hole that exposes said auxiliary drain electrode; and
   a second capacitor electrode on the third passivation layer, the second capacitor electrode electrically contacting the drain electrode and overlapping the first capacitor electrode thereby forming a storage capacitor with the first capacitor electrode and the third passivation layer;
   wherein the second and third passivation layers have a second gate pad contact hole that exposes the gate pad electrode, a second data pad contact hole that exposes the data pad electrode, and a ground pad contact hole that exposes the ground pad electrode.

2. The array substrate according to claim 1, further comprising an ohmic contact layer on the active layer.

3. The array substrate according to claim 1, wherein the gate line, the gate electrode, the gate linking line and the gate pad have a double-layered structure that includes a first layer and a second layer.

4. The array substrate according to claim 3, wherein the first layer includes aluminum (Al).

5. The array substrate according to claim 3, wherein the second layer is formed of a metallic material selected from chromium (Cr), tungsten (W) and molybdenum (Mo).

6. The array substrate according to claim 1, wherein the gate pad electrodes, the data pad electrodes and the ground pad electrodes are formed in the same plane using the same material.

7. The array substrate according to claim 1, wherein the second capacitor electrode extends over the thin film transistor.

8. The array substrate according to claim 1, wherein the second passivation layer includes benzocyclobutene (BCB).

9. The array substrate according to claim 1, wherein the second passivation layer includes acryl-based resin.

10. The array substrate according to claim 1, wherein the first passivation layer is formed at a temperature of about 230 degrees centigrade.

11. The array substrate according to claim 1, wherein the silicon insulator includes silicon oxide ($SiN_x$).

12. The array substrate according to claim 1, wherein the silicon insulator includes silicon oxide ($SiO_2$).

13. The array substrate according to claim 1, wherein the second capacitor electrode electrically contacts the drain electrode via the auxiliary drain electrode.

14. The array substrate according to claim 1, wherein the third passivation layer is formed of an inorganic material at a temperature of about 230 degrees centigrade.

15. The array substrate according to claim 14, wherein the inorganic material includes silicon nitride ($SiN_x$).

16. The array substrate according to claim 14, wherein the inorganic material includes silicon oxide ($SiO_2$).

17. A method of fabricating an array substrate for X-ray detector, comprising:

forming a gate line on a substrate that has a switching region and a pixel region, the gate line having a gate linking line and a gate pad at the end thereof;

forming a gate insulation layer on said substrate to cover said gate line;

forming a data line on said gate insulation layer, the data line perpendicularly crossing said gate line to define the pixel region and having a data linking line and a data pad at the end thereof;

forming a thin film transistor in the switching region near the crossing of the said gate and data lines, wherein the thin film transistor includes a gate electrode, an active layer, a source electrode, a drain electrode and said gate insulation layer;

forming a ground line that crosses said pixel region parallel with the data line and having a ground linking line and a ground pad at the end thereof;

forming a first passivation layer formed of a silicon insulator, the first passivation layer covering said thin film transistor and having a first drain contact hole that exposes the drain electrode and a first ground line contact hole that exposes the ground line;

forming a gate pad electrode on the first passivation layer, wherein the gate pad electrode contacts the gate pad through a first gate pad contact hole that penetrates both the gate insulation layer and the first passivation layer;

forming a data pad electrode on the first passivation layer, wherein the data pad electrodes contacts the data pad though a first data pad contact hole that penetrates the first passivation layer;

forming a ground pad electrode on the first passivation layer, wherein the ground pad electrode contacts the ground pad though a first ground pad contact hole that penetrates the first passivation layer;

forming a second passivation layer formed of an organic material on the said first passivation layer, the second passivation layer covering the gate pad electrode, the data pad electrode and the ground pad electrode, and having a second drain contact hole that exposes the drain electrode and a second ground line contact bole that exposes the ground line;

forming a first capacitor electrode on the second passivation layer, the first capacitor electrode contacting the ground line through said first and second ground line contact holes;

forming an auxiliary drain electrode on the second passivation layer, the auxiliary drain electrode contacting the drain electrode through said first and second drain contact holes;

forming a third passivation layer on the second passivation layer, the third passivation layer covering the auxiliary drain electrode and the first capacitor electrode, and having an auxiliary drain contact hole that exposes said auxiliary drain electrode;

forming a second capacitor electrode on the third passivation layer, the second capacitor electrode electrically contacting the drain electrode and overlapping the first capacitor electrode thereby forming a storage capacitor with the first capacitor electrode and the third passivation layer; and etching portions of the second and third passivation layers to form a second gate pad contact hole that exposes the gate pad electrode, a second data pad contact bole that exposes the data pad electrode and a ground pad contact hole that exposes the ground pad electrode.

18. The method of fabricating an array substrate according to claim 17, further comprising forming an ohmic contact layer on the active layer.

19. The method of fabricating an array substrate according to claim 18, further comprising etching a portion of the ohmic contact layer using the source and drain electrodes as masks so as to form an active channel on the active layer.

20. The method of fabricating an array substrate according to claim 17, wherein the gate line, the gaze electrode, the gate linking line and the gate pad have a double-layered structure that includes a first layer and a second layer.

21. The method of fabricating an array substrate according to claim 20, wherein the first layer includes aluminum (Al).

22. The method of fabricating array substrate according to claim 20, wherein the second layer includes a metallic material selected form chromium (Cr), tungsten (W) and molybdenum (Mo).

23. The method of fabricating an array substrate according to claim 17, wherein the gate pad electrode, the data pad electrode and the ground pad electrode are simultaneously formed in the same plane using the same material.

24. The method of fabricating an array substrate according to claim 17, wherein the second capacitor electrode extends over the thin film transistor.

25. The method of fabricating an array substrate according to claim 17, wherein the second passivation layer includes benzocyclobutene (BCB).

26. The method of fabricating an array substrate according to claim 17, wherein the second passivation layer includes acryl-based resin.

27. The method of fabricating an array substrate according to claim 17, wherein the first passivation layer is formed at a temperature of about 230 degrees centigrade.

28. The method of fabricating an array substrate according to claim 17, wherein the silicon insulator includes silicon nitride ($SiN_x$).

29. The method of fabricating an array substrate according to claim 17, wherein the silicon insulator includes silicon oxide ($SiO_2$).

30. The method of fabricating an array substrate according to claim 17, wherein the first and second capacitor electrodes are formed of indium tin oxide (ITO).

31. The method of fabricating an array substrate according to claim 17, wherein the first and second capacitor electrodes are formed of indium zinc oxide (IZO).

32. The method of fabricating an array substrate according to claim 17, wherein the second capacitor electrode electrically contacts the drain electrode via the auxiliary drain electrode.

33. The method of fabricating an array substrate according to claim 17, wherein the third passivation layer is formed of an inorganic material at a temperature of about 230 degrees centigrade.

34. The method of fabricating an array substrate according to claim 33, wherein the inorganic material includes silicon nitride ($SiN_x$).

35. The method of fabricating an array substrate according to claim 33, wherein the inorganic material includes silicon oxide ($SiO_2$).

* * * * *